United States Patent
Wang et al.

(10) Patent No.: US 9,600,703 B2
(45) Date of Patent: Mar. 21, 2017

(54) SYSTEMS AND METHODS FOR SORTING IMAGE ACQUISITION SETTINGS FOR PATTERN STITCHING AND DECODING USING MULTIPLE CAPTURED IMAGES

(71) Applicants: Xianju Wang, Bedford, MA (US); Xiangyun Ye, Framingham, MA (US); James A. Negro, Arlington, MA (US); David Vekony, Budapest (HU); Robb Robles, Wilsonville, OR (US); Jozsef Borovszki, Budapest (HU); Steven G. Webster, Tigard, OR (US)

(72) Inventors: Xianju Wang, Bedford, MA (US); Xiangyun Ye, Framingham, MA (US); James A. Negro, Arlington, MA (US); David Vekony, Budapest (HU); Robb Robles, Wilsonville, OR (US); Jozsef Borovszki, Budapest (HU); Steven G. Webster, Tigard, OR (US)

(73) Assignee: Cognex Corporation, Natick, MA (US)

( * ) Notice: Subject to any disclaimer, the term of this patent is extended or adjusted under 35 U.S.C. 154(b) by 0 days.

(21) Appl. No.: 14/821,920

(22) Filed: Aug. 10, 2015

(65) Prior Publication Data

US 2015/0347802 A1 Dec. 3, 2015

Related U.S. Application Data

(63) Continuation-in-part of application No. 13/843,057, filed on Mar. 15, 2013, now Pat. No. 9,104,932.

(51) Int. Cl.
*G06K 7/10* (2006.01)
*G06K 7/14* (2006.01)
*H01L 21/00* (2006.01)

(52) U.S. Cl.
CPC ......... *G06K 7/1491* (2013.01); *G06K 7/1417* (2013.01); *H01L 21/00* (2013.01)

(58) Field of Classification Search
CPC ............. G06K 7/1417; G06K 7/10722; G06K 7/1456; G06K 7/1491; G06K 7/10851;
(Continued)

(56) References Cited

U.S. PATENT DOCUMENTS 5,262,626 A 11/1993 Goren et al.
6,446,868 B1 9/2002 Robertson et al.
(Continued)

FOREIGN PATENT DOCUMENTS

DE 202012102113 U1 3/2012
EP 0896290 B1 10/2004
(Continued)

OTHER PUBLICATIONS

PCT International Search Report and Written Opinion, PCT/US2008/083191, Feb. 17, 2009.
(Continued)

*Primary Examiner* — Thien M Le
(74) *Attorney, Agent, or Firm* — Quarles & Brady LLP

(57) ABSTRACT

Systems and methods are described for acquiring and decoding a plurality of images. First images are acquired and then processed to attempt to decode a symbol. Contributions of the first images to the decoding attempt are identified. An updated acquisition-settings order is determined based at least partly upon the contributions of the first images to the decoding attempt. Second images are acquired or processed based at least partly upon the updated acquisition-settings order.

29 Claims, 21 Drawing Sheets

(58) Field of Classification Search
CPC ...... G06K 7/14; G06K 7/1443; G06K 7/1465; G06K 7/1473; H04N 5/2252; H04N 5/247; H04N 1/3876; H04N 13/0048; H04N 13/0239

USPC .............. 235/462.01–462.45, 472.01–472.03

See application file for complete search history.

(56) References Cited

U.S. PATENT DOCUMENTS

| | | | |
|---|---|---|---|
| 8,717,405 B2 * | 5/2014 | Li | 348/14.08 |
| 8,723,953 B2 * | 5/2014 | Klomp | 348/144 |
| 2001/0042789 A1 | 11/2001 | Krichever et al. | |
| 2002/0017565 A1 * | 2/2002 | Ju | G06K 7/10722 235/454 |
| 2003/0062418 A1 | 4/2003 | Barber et al. | |
| 2003/0184778 A1 * | 10/2003 | Chiba | G06T 7/0028 358/1.9 |
| 2003/0201328 A1 | 10/2003 | Jam et al. | |
| 2005/0275831 A1 | 12/2005 | Silver | |
| 2006/0022052 A1 | 2/2006 | Patel et al. | |
| 2006/0131419 A1 | 6/2006 | Nunnink | |
| 2006/0133757 A1 | 6/2006 | Nunnink | |
| 2006/0249581 A1 | 11/2006 | Smith | |
| 2006/0283952 A1 | 12/2006 | Wang | |
| 2007/0181692 A1 | 8/2007 | Barkan et al. | |
| 2007/0295814 A1 * | 12/2007 | Tanaka | G06K 7/10722 235/454 |
| 2009/0121027 A1 | 5/2009 | Nadabar | |
| 2010/0295945 A1 * | 11/2010 | Plemons | B60R 1/00 348/148 |
| 2011/0007967 A1 * | 1/2011 | Soderberg | G06K 7/14 382/165 |
| 2011/0073655 A1 | 3/2011 | Simske et al. | |
| 2013/0134222 A1 | 5/2013 | Gässler et al. | |
| 2015/0221116 A1 * | 8/2015 | Wu | A61B 1/00009 382/128 |

FOREIGN PATENT DOCUMENTS

| | | |
|---|---|---|
| EP | 1469420 A2 | 10/2004 |
| EP | 1975849 A1 | 10/2008 |
| JP | 2005-012619 | 1/2005 |
| JP | 2005012619 A | 1/2005 |
| JP | 2005-276119 | 6/2005 |
| JP | 2005276119 A | 10/2005 |
| JP | 2010-066822 | 3/2010 |
| JP | 2010066822 A | 3/2010 |
| WO | 03102859 A1 | 12/2003 |
| WO | 2008118419 A1 | 10/2008 |
| WO | 2008118425 A1 | 10/2008 |
| WO | 2009064759 A1 | 5/2009 |

OTHER PUBLICATIONS

United States Patent and Trademark Office, Office Action Summary and Detailed Action, U.S. Appl. No. 12/267,342, Dec. 21, 2009.

United States Patent and Trademark Office, Office Action Summary and Detailed Action, U.S. Appl. No. 12/267,342, Aug. 3, 2010.

United States Patent and Trademark Office, Office Action Summary and Detailed Action, U.S. Appl. No. 12/267,342, Jan. 5, 2011.

European Patent Office, European Search Report in Application No. 14152881.0-1806; dated Aug. 6, 2014.

* cited by examiner

| Read Cycle | Tool | Index | Lighting Setting | Point Value |
|---|---|---|---|---|
| 1 | 2-D | 11 | BF3 P02 | 750 |
| | | 4 | DF1 P20 | 250 |
| | OCR | 3 | BF3 P01 | 334 |
| | | 6 | DF3 P20 | 333 |
| | | 9 | BF2 P02 | 333 |
| 2 | 2-D | 11 | BF3 P02 | 750 |
| | | 4 | DF1 P20 | 250 |
| | OCR | 3 | BF3 P01 | 334 |
| | | 6 | DF3 P20 | 333 |
| | | 9 | BF2 P02 | 333 |
| 3 | 2-D | 11 | BF3 P02 | 750 |
| | | 4 | DF1 P20 | 250 |
| | OCR | 3 | BF3 P01 | 334 |
| | | 6 | DF3 P20 | 333 |
| | | 9 | BF2 P02 | 333 |
| 4 | 2-D | 11 | BF3 P02 | 750 |
| | | 4 | DF1 P20 | 250 |
| | OCR | 3 | BF3 P01 | 334 |
| | | 6 | DF3 P20 | 333 |
| | | 9 | BF2 P02 | 333 |
| 5 | 2-D | 17 | BF3 P03 | 1000 |
| | OCR | 7 | BF1 P02 | 500 |
| | | 3 | BF3 P01 | 500 |
| 6 | 2-D | Fails | | 0 |
| | OCR | Fails | | 0 |
| 7 | 2-D | Fails | | 0 |
| | OCR | 5 | DF3 P20 | 1000 |
| 8 | 2-D | 8 | DF2 P40 | 1000 |
| | OCR | 13 | BF1 P03 | 500 |
| | | 14 | DF1 P60 | 500 |
| 9 | 2-D | 5 | DF3 P20 | 750 |
| | | 8 | DF2 P40 | 250 |
| | OCR | 7 | BF1 P02 | 500 |
| | | 3 | BF3 P01 | 500 |

FIG. 30

| Index | Read cycle | | | | | | | | |
|---|---|---|---|---|---|---|---|---|---|
| | 1 | 2 | 3 | 4 | 5 | 6 | 7 | 8 | 9 |
| User Entry | | | | | | | | | |
| 1 | 0 | 0 | 0 | 0 | 0 | 0 | 0 | 0 | 0 |
| 2 | 0 | 0 | 0 | 0 | 0 | 0 | 0 | 0 | 0 |
| 3 | 167 | 167 | 167 | 167 | 0 | 0 | 0 | 0 | 250 |
| 4 | 125 | 125 | 125 | 125 | 0 | 0 | 0 | 0 | 0 |
| 5 | 0 | 0 | 0 | 0 | 0 | 0 | 0 | 0 | 0 |
| 6 | 167 | 167 | 167 | 167 | 250 | 0 | 0 | 0 | 375 |
| 7 | 0 | 0 | 0 | 0 | 0 | 0 | 1000 | 0 | 0 |
| 8 | 166 | 166 | 166 | 166 | 0 | 0 | 0 | 0 | 0 |
| 9 | 0 | 0 | 0 | 0 | 0 | 0 | 0 | 500 | 250 |
| 10 | 375 | 375 | 375 | 375 | 0 | 0 | 0 | 0 | 125 |
| 11 | 0 | 0 | 0 | 0 | 0 | 0 | 0 | 0 | 0 |
| 12 | 0 | 0 | 0 | 0 | 0 | 0 | 0 | 0 | 0 |
| 13 | 0 | 0 | 0 | 0 | 0 | 0 | 0 | 250 | 0 |
| 14 | 0 | 0 | 0 | 0 | 0 | 0 | 0 | 250 | 0 |
| 15 | 0 | 0 | 0 | 0 | 500 | 0 | 0 | 0 | 0 |
| 16 | 0 | 0 | 0 | 0 | 0 | 0 | 0 | 0 | 0 |
| 17 | 0 | 0 | 0 | 0 | 0 | 0 | 0 | 0 | 0 |
| 18 | 0 | 0 | 0 | 0 | 0 | 0 | 0 | 0 | 0 |
| Total Points: | 1000 | 1000 | 1000 | 1000 | 1000 | 0 | 1000 | 1000 | 1000 |

FIG. 31

| Index | Init | 1 | 2 | 3 | 4 | 5 | 6 | 7 | 8 | 9 |
|---|---|---|---|---|---|---|---|---|---|---|
| User Entry | | | | | | | | | | |
| 1 | 56 | 53 | 51 | 49 | 47 | 45 | 45 | 44 | 42 | 40 |
| 2 | 56 | 53 | 51 | 49 | 47 | 45 | 45 | 44 | 42 | 40 |
| 3 | 56 | 60 | 64 | 68 | 72 | 79 | 79 | 76 | 73 | 80 |
| 4 | 56 | 58 | 61 | 63 | 66 | 63 | 63 | 61 | 58 | 56 |
| 5 | 56 | 53 | 51 | 49 | 47 | 45 | 45 | 83 | 80 | 91 |
| 6 | 56 | 60 | 64 | 68 | 72 | 69 | 69 | 66 | 64 | 61 |
| 7 | 56 | 53 | 51 | 49 | 47 | 55 | 55 | 53 | 51 | 59 |
| 8 | 56 | 60 | 64 | 68 | 72 | 69 | 69 | 66 | 64 | 64 |
| 9 | 56 | 53 | 51 | 49 | 47 | 45 | 45 | 44 | 42 | 61 |
| 10 | 56 | 68 | 80 | 92 | 103 | 99 | 99 | 95 | 91 | 40 |
| 11 | 55 | 53 | 51 | 49 | 47 | 45 | 45 | 44 | 42 | 88 |
| 12 | 55 | 53 | 51 | 49 | 47 | 45 | 45 | 44 | 42 | 40 |
| 13 | 55 | 53 | 51 | 49 | 47 | 45 | 45 | 44 | 52 | 50 |
| 14 | 55 | 53 | 51 | 49 | 47 | 45 | 45 | 44 | 52 | 50 |
| 15 | 55 | 53 | 51 | 49 | 47 | 45 | 45 | 44 | 42 | 40 |
| 16 | 55 | 53 | 51 | 49 | 47 | 65 | 65 | 63 | 42 | 40 |
| 17 | 55 | 53 | 51 | 49 | 47 | 45 | 45 | 44 | 60 | 58 |
| 18 | 55 | 53 | 51 | 49 | 47 | 45 | 45 | 44 | 42 | 40 |
| Total Points: | 1000 | 1000 | 1000 | 1000 | 1000 | 1000 | 0 | 1000 | 1000 | 1000 |

| Read cycle | | | | | | | | | |
|---|---|---|---|---|---|---|---|---|---|
| Init | 1 | 2 | 3 | 4 | 5 | 6 | 7 | 8 | 9 |
| - | - | - | - | - | - | - | - | - | - |
| 1 | 11 | 11 | 11 | 11 | 11 | 11 | 11 | 11 | 5 |
| 2 | 3 | 3 | 3 | 3 | 3 | 3 | 5 | 5 | 11 |
| 3 | 6 | 6 | 6 | 6 | 6 | 6 | 3 | 3 | 3 |
| 4 | 9 | 9 | 9 | 9 | 9 | 9 | 6 | 6 | 8 |
| 5 | 4 | 4 | 4 | 4 | 4 | 17 | 9 | 9 | 6 |
| 6 | 1 | 1 | 1 | 1 | 7 | 4 | 17 | 8 | 9 |
| 7 | 2 | 2 | 2 | 2 | 1 | 7 | 4 | 17 | 7 |
| 8 | 5 | 5 | 5 | 5 | 2 | 1 | 7 | 4 | 17 |
| 9 | 7 | 7 | 7 | 7 | 5 | 2 | 1 | 13 | 4 |
| 10 | 8 | 8 | 8 | 8 | 8 | 5 | 2 | 14 | 13 |
| 11 | 10 | 10 | 10 | 10 | 10 | 8 | 8 | 7 | 14 |
| 12 | 12 | 12 | 12 | 12 | 12 | 10 | 10 | 1 | 1 |
| 13 | 13 | 13 | 13 | 13 | 13 | 12 | 12 | 2 | 2 |
| 14 | 14 | 14 | 14 | 14 | 14 | 13 | 13 | 10 | 10 |
| 15 | 15 | 15 | 15 | 15 | 15 | 14 | 14 | 12 | 12 |
| 16 | 16 | 16 | 16 | 16 | 16 | 15 | 15 | 15 | 15 |
| 17 | 17 | 17 | 17 | 17 | 17 | 16 | 16 | 16 | 16 |
| 18 | 18 | 18 | 18 | 18 | 18 | 18 | 18 | 18 | 18 |

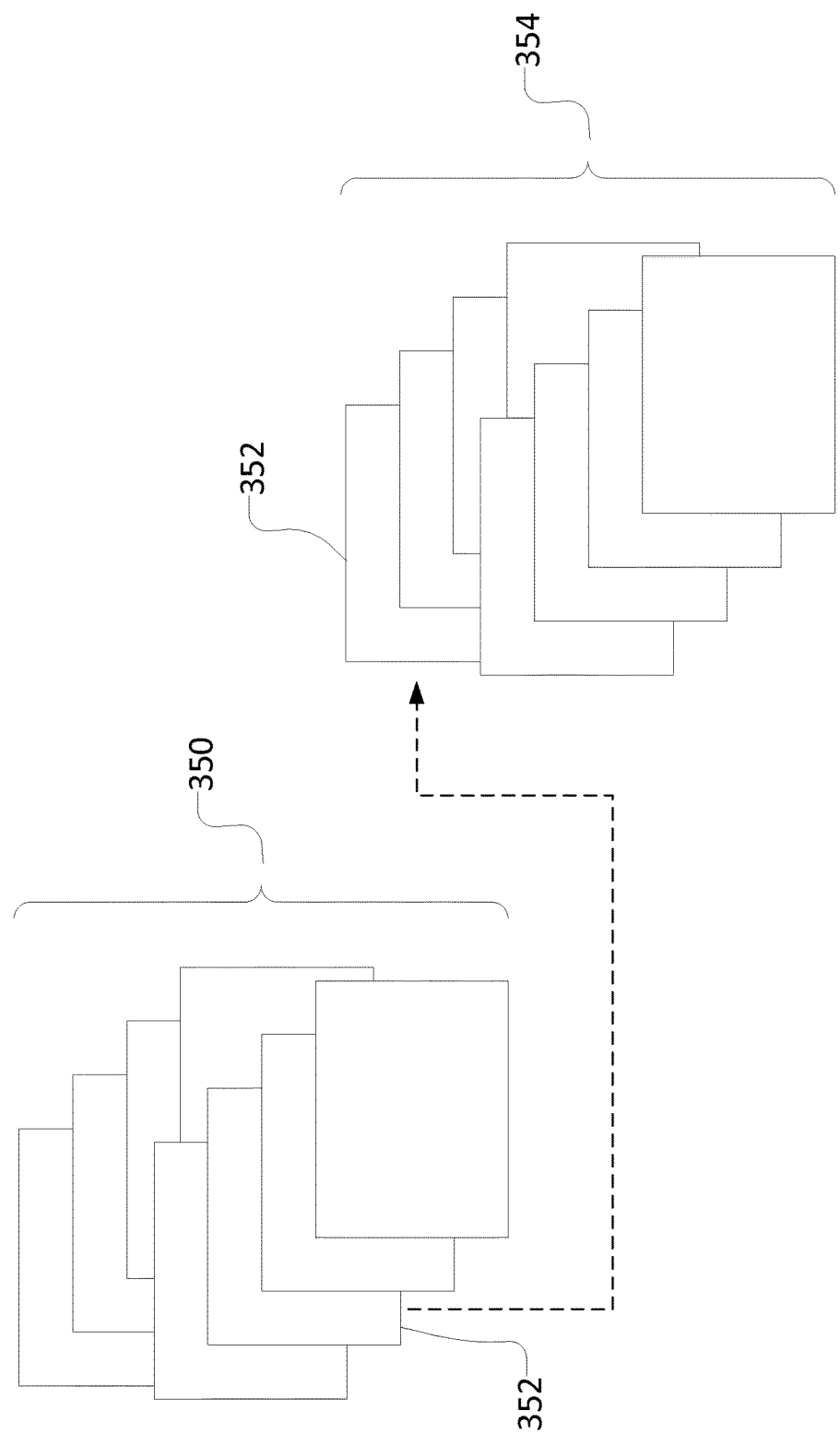

SYSTEMS AND METHODS FOR SORTING IMAGE ACQUISITION SETTINGS FOR PATTERN STITCHING AND DECODING USING MULTIPLE CAPTURED IMAGES

CROSS-REFERENCE TO RELATED APPLICATIONS

This application is a continuation-in-part of pending U.S. application Ser. No. 13/843,057, which was filed on Mar. 15, 2013, which is hereby incorporated by reference.

STATEMENT REGARDING FEDERALLY SPONSORED RESEARCH OR DEVELOPMENT

Not applicable.

BACKGROUND OF THE TECHNOLOGY

The present technology relates to imaging systems and methods for decoding images, and more specifically, to imaging systems and methods for determining an order for applying image acquisition settings during the acquisition of multiple images.

Imaging systems use image acquisition devices that include camera sensors to deliver information on a viewed subject. The system then interprets this information according to a variety of algorithms to perform a programmed decision-making and/or identification function. For an image to be most-effectively acquired by a sensor in the visible, and near-visible light range, the subject is typically illuminated.

Symbology reading (also commonly termed "barcode" scanning) using an image sensor, entails the aiming of an image acquisition sensor (CMOS camera, CCD, etc.) at a location on an object that contains a symbol (a "barcode" for example), and acquiring an image of that symbol. The symbol contains a set of predetermined patterns that represent an ordered group of characters or shapes from which an attached data processor (for example a microcomputer) can derive useful information about the object (e.g. its serial number, type, model, price, etc.). Symbols/barcodes are available in a variety of shapes and sizes. Two of the most commonly employed symbol types used in marking and identifying objects are the so-called one-dimensional barcode, consisting of a line of vertical stripes of varying width and spacing, and the so-called two-dimensional barcode consisting of a two-dimensional array of dots or rectangles.

In many imaging applications, surface features, illumination, part movement, vibration or a multitude of other variations can result in individual images of a symbol that, on their own, can each be partially unreadable. For example, an imaging system can capture a plurality of images of a symbol on an object as the object is moving down a conveyor line. In this arrangement, relative movement between the imaging device and the object can occur, as well as other phenomenon detrimental to image analysis (e.g., as noted above). Accordingly, the symbol in one or more of the images can be partially unreadable.

While the exemplary machine vision detector may acquire multiple images of the object/feature of interest as it passes through the field of view, each image is used individually to perform a detection and/or triggering function.

BRIEF SUMMARY OF THE TECHNOLOGY

The present embodiments overcome the disadvantages of the prior art by providing systems and methods for determining an order for applying image acquisition settings, for example exposure time or light settings, during the acquisition of multiple images, which may be useful, in some embodiments, for decoding symbol data based upon information from multiple images of the symbol. Multiple images can be acquired, and the images assigned a point value associated with an attempted decoding of the images. An acquisition settings table can then be sorted based at least partly on the assigned point values, with a subsequent capture or processing of a set of images utilizing different image acquisition settings with an order based upon the sorted order of the acquisition settings table.

Accordingly, some embodiments comprise a method for decoding a symbol using images of the symbol. The method can include generating a synthetic model of the symbol, including a model of a plurality of known features of the symbol. A first image and a second image for a first read cycle can be acquired, using an imaging device, with the first image being acquired using first acquisition settings and including a first symbol data region, and the second image being acquired using second acquisition settings and including a second symbol data region. The synthetic model of the symbol can be compared with the first and second image and first and second binary matrices, respectively, can be extracted. The first binary matrix can be at least partly combined with the second binary matrix and a combined binary matrix generated, with the combined binary matrix being a decodable representation of the symbol. An attempt to decode the symbol can be made based at least partly upon the combined binary matrix. First and second contributions, respectively, of the first and second images to the attempt to decode the symbol can be identified. An updated acquisition-settings order can be determined for at least the first and second acquisition settings, based at least partly upon the first and second contributions. The imaging device can be caused to acquire a third image for a second read cycle, using third acquisition settings determined based at least partly upon the updated acquisition-settings order.

Other embodiments comprise another method for decoding a symbol using images of the symbol, where first images have been acquired in a first acquisition order with an imaging device using an initial sequence of respective acquisition settings that is determined based at least partly upon an initial acquisition-settings order. The method can include processing the first images to attempt to decode the symbol by, at least in part, stitching image data from two or more of the first images. A corresponding at least one contribution to the attempt to decode the symbol can be identified for at least one of the two or more of the first images that was acquired using at least one of the initial acquisition settings. An updated acquisition-settings order can be determined for the collective initial acquisition settings based at least partly upon the at least one contribution. Second images can be acquired with the imaging device using an updated sequence of second acquisition settings that is determined based at least partly upon the updated acquisition-settings order or the second images can be processed in a decoding attempt using a processing order that is determined based at least partly upon the updated acquisition-settings order.

Consistent with the above, some embodiments include a system for decoding a symbol using images of the symbol. An imaging device can be configured to acquire multiple images, with each of the acquired images including a respective symbol data region. A processor operatively coupled to the imaging device can be configured to receive a first plurality of images for a first read cycle of the system.

The first plurality of images can be acquired by the imaging device in a first acquisition order using respective acquisition settings, and can include first and second images that are acquired, respectively, using first and second acquisition settings determined according to an initial acquisition-settings order. The processor can be further configured to execute a data stitching algorithm including generating a synthetic model of the symbol, including a model of a plurality of known features of the symbol, comparing the synthetic model of the symbol with at least the first and second images, converting a first symbol data region of the first image into a first binary matrix, converting a second symbol data region of the second image into a second binary matrix, at least partly combining the first binary matrix with the second binary matrix to generate a combined binary matrix that includes a decodable representation of the symbol. The processor can be further configured to attempt to decode the symbol based at least partly upon the combined binary matrix and to receive a second plurality of images for a second read cycle of the system. The second plurality of images can be acquired by the imaging device in a second acquisition order using updated acquisition settings that are determined according to an updated acquisition-settings order. The updated acquisition-settings order can be determined based at least partly upon first and second contributions of the first and second images, respectively, to the attempt to decode the symbol.

Still other embodiments include a system for decoding a symbol using images of the symbol. An imaging device can be configured to acquire multiple images, with each of the acquired images including a respective symbol data region. A processor operatively coupled to the imaging device can be configured to receive a first plurality of images for a first read cycle of the system. The first plurality of images can be acquired by the imaging device in a first acquisition order using respective acquisition settings, and can include first and second images that are acquired, respectively, using first and second acquisition settings determined according to an initial acquisition-settings order. The processor can be further configured to execute a data stitching algorithm including generating a synthetic model of the symbol, including a model of a plurality of known features of the symbol, comparing the synthetic model of the symbol with at least the first and second images, converting a first symbol data region of the first image into a first binary matrix, converting a second symbol data region of the second image into a second binary matrix, at least partly combining the first binary matrix with the second binary matrix to generate a combined binary matrix that includes a decodable representation of the symbol. The processor can be further configured to attempt to decode the symbol based at least partly upon the combined binary matrix and to receive a second plurality of images for a second read cycle of the system. The second plurality of images can be processed for decoding in a processing order that can be determined based at least partly upon first and second contributions of the first and second images, respectively, to the attempt to decode the symbol.

To the accomplishment of the foregoing and related ends, the technology, then, comprises the features hereinafter fully described. The following description and the annexed drawings set forth in detail certain illustrative aspects of the technology. However, these aspects are indicative of but a few of the various ways in which the principles of the technology can be employed. Other aspects, advantages and novel features of the technology will become apparent from the following detailed description of the technology when considered in conjunction with the drawings.

BRIEF DESCRIPTION OF THE SEVERAL VIEWS OF THE DRAWINGS

FIG. 30 shows a table representing a set of read cycles for images captured with image acquisition settings from the table of FIG. 29, and point allocations for the images based on results of the read cycles;

FIG. 31 shows the point allocations of FIG. 30, scaled for calculation of average sorting values for an acquisition settings table;

FIG. 32 shows an exponential moving average of sorting values calculated based on the scaled point allocations of FIG. 31;

FIG. 33 shows sorted orders of the averaged sorting values of FIG. 32;

FIG. 34 shows the sorted orders of FIG. 32 in a first table, with image acquisition settings contributing to successful symbol decoding presented in a second, separate table;

FIG. 35 shows updated orders for image acquisition settings based on the first and second tables of FIG. 34; and FIG. 36 shows different sets of images used for different decoding attempts.

Figure 1:
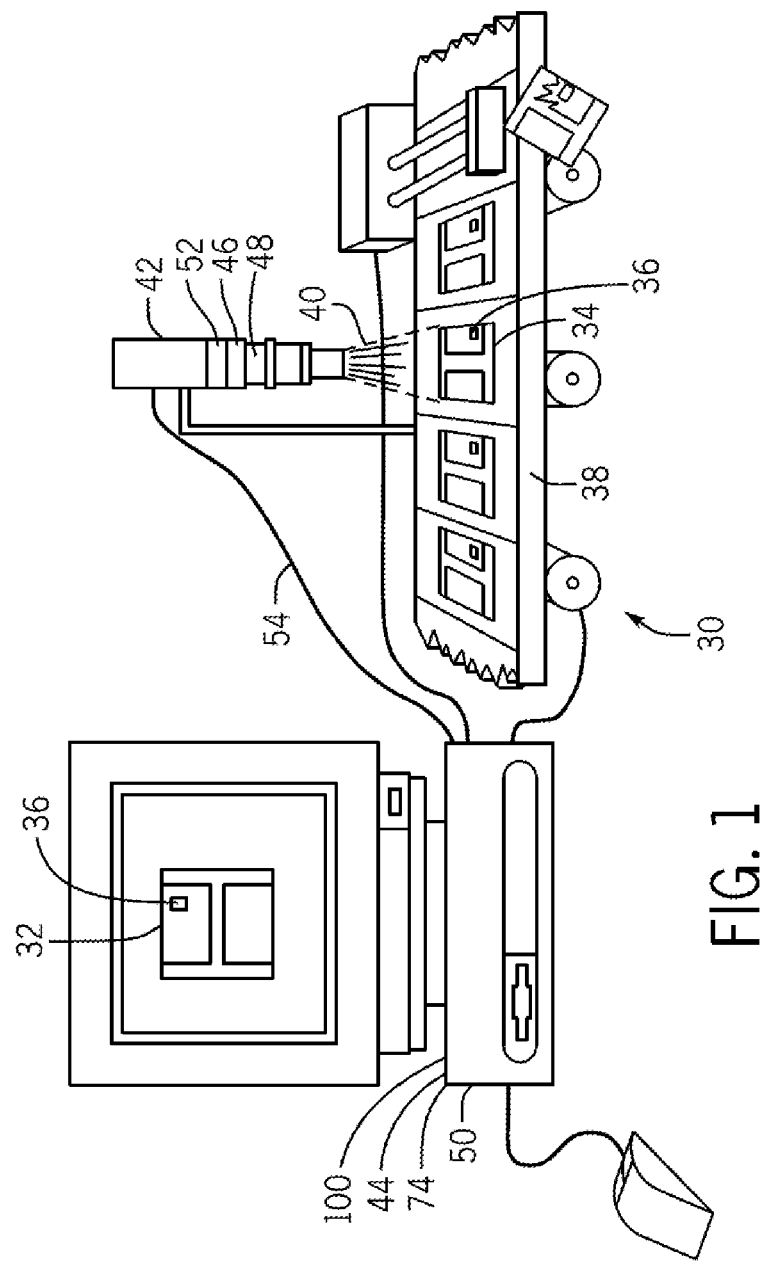
FIG. 1 is a schematic view of a typical vision system configuration including a fixed scanner for acquiring a plurality of images of an object, in accordance with the present embodiments.
Figure 2:
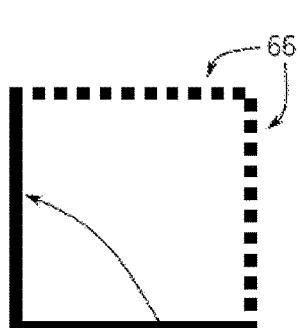
FIGS. 2-7 are views of various 2D matrix symbol features and styles.
Figure 3:
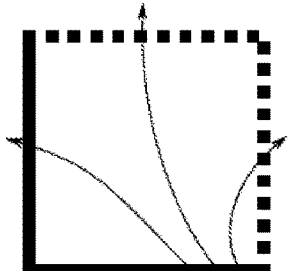
Figure 4:
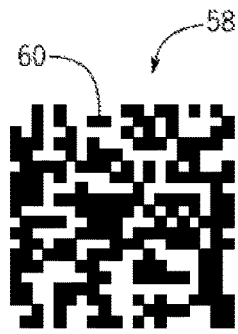

While the technology is susceptible to various modifications and alternative forms, specific embodiments thereof have been shown by way of example in the drawings and are herein described in detail. It should be understood, however, that the description herein of specific embodiments is not intended to limit the technology to the particular forms disclosed, but on the contrary, the intention is to cover all modifications, equivalents, and alternatives falling within the spirit and scope of the technology as defined by the appended claims.

DETAILED DESCRIPTION OF THE TECHNOLOGY

The various aspects of the subject technology are now described with reference to the annexed drawings, wherein like reference numerals correspond to similar elements throughout the several views. It should be understood, however, that the drawings and detailed description hereafter relating thereto are not intended to limit the claimed subject matter to the particular form disclosed. Rather, the intention is to cover all modifications, equivalents, and alternatives falling within the spirit and scope of the claimed subject matter.

As used herein, the terms "component," "system," "device" and the like are intended to refer to either hardware, a combination of hardware and software, software, or software in execution. The word "exemplary" is used herein to mean serving as an example, instance, or illustration. Any aspect or design described herein as "exemplary" is not necessarily to be construed as preferred or advantageous over other aspects or designs.

Furthermore, the disclosed subject matter may be implemented as a system, method, apparatus, or article of manufacture using standard programming and/or engineering techniques and/or programming to produce hardware, firmware, software, or any combination thereof to control an electronic based device to implement aspects detailed herein.

Unless specified or limited otherwise, the terms "connected," and "coupled" and variations thereof are used broadly and encompass both direct and indirect mountings, connections, supports, and couplings. Further, "connected" and "coupled" are not restricted to physical or mechanical connections or couplings. As used herein, unless expressly stated otherwise, "connected" means that one element/feature is directly or indirectly connected to another element/feature, and not necessarily electrically or mechanically. Likewise, unless expressly stated otherwise, "coupled" means that one element/feature is directly or indirectly coupled to another element/feature, and not necessarily electrically or mechanically.

As used herein, the term "processor" may include one or more processors and memories and/or one or more programmable hardware elements. As used herein, the term "processor" is intended to include any of types of processors, CPUs, microcontrollers, digital signal processors, or other devices capable of executing software instructions.

As used herein, the term "memory" includes a nonvolatile medium, e.g., a magnetic media or hard disk, optical storage, or flash memory; a volatile medium, such as system memory, e.g., random access memory (RAM) such as DRAM, SRAM, EDO RAM, RAMBUS RAM, DR DRAM, etc.; or an installation medium, such as software media, e.g., a CD-ROM, or floppy disks, on which programs may be stored and/or data communications may be buffered. The term "memory" may also include other types of memory or combinations thereof.

Embodiments of the technology are described below by using diagrams to illustrate either the structure or processing of embodiments used to implement the embodiments of the present technology. Using the diagrams in this manner to present embodiments of the technology should not be construed as limiting of its scope. The present technology contemplates both an electronic device configuration and systems and methods for stitching and decoding images using data combined from multiple captured images.

The various embodiments of a machine vision system will be described in connection with a fixed mount scanner adapted to scan a 2D matrix symbol and capable of decoding a symbol based on locating regions of interest in a plurality of images of the symbol that include unreadable regions, and combining the regions of interest to create a decodable image of the symbol. That is because the features and advantages of the technology are well suited for this purpose. Still, it should be appreciated that the various aspects of the technology can be applied in other forms of machine readable symbols, imaging systems, and imaging applications, including robotic controlled scanners, handheld imaging systems, and any other imaging system that may benefit from the ability to decode a symbol using image data combined from multiple captured images.

FIG. 1 shows an illustrative machine vision system 30 adapted to acquire one or more images 32 of an object 34 containing a machine readable symbol 36. Conveyor 38 transports the objects 34 and causes relative movement between the objects 34 and the field of view 40 of an imaging device 42. Exemplary machine vision systems may be used in a manufacturing assembly, test, measurement, automation, and/or control application, among others, as non-limiting examples. Machine vision system 30 may use image acquisition software 44 operable to perform any of various types of image acquisitions.

Imaging device 42 can include a processor 46 used for image processing and decoding, for example. The processor 46 can be coupled to a vision sensor 48, and can either be part of the vision sensor 48, or it can be locally linked to the vision sensor 48. The processor 46 can be encoded with the image acquisition software 44, or in some embodiments, the image acquisition software 44 can be run on a separate computing device 50 or processor. The image acquisition software 44 can be configured to, among other things, acquire multiple images within a single reading operation, control illumination, acquire image data, and process/decode the acquired image data into usable information.

Imaging device 42 can also include a memory medium 52 coupled to the vision sensor 48 and/or the processor 46. The memory medium 52 can be used for storing scanned or processed images 32 and buffering data and communications, and the like. A communication line 54 can also be coupled to the imaging device 42, and provide a connection point to an optional computer 50. The computer 50 can be used for uploading and downloading scanned or processed images 32, for example. It is to be appreciated that wireless communications are also contemplated. In this example, the imaging device 42 can be a conventional fixed mount scanner capable of providing high-angle and/or low-angle illumination, or a combination of high and low-angle illumination.

The various embodiments described herein allow combining image data from multiple images 32 of the object 34 to enable decoding symbols 36 that are otherwise not decodable from individual images. In particular, the various embodiments will be described in the context of imaging and decoding 2D matrix symbols. In this example, the symbol 36 is applied on a surface of the object 34 that is generally flat. Because the object 34 may be partially covered at times, not illuminated properly, or for any other reason, some portions of the symbol 36 can be rendered unreadable.

Figure 5:
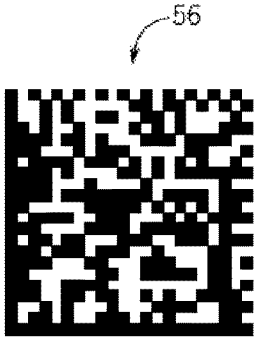
Figure 6:
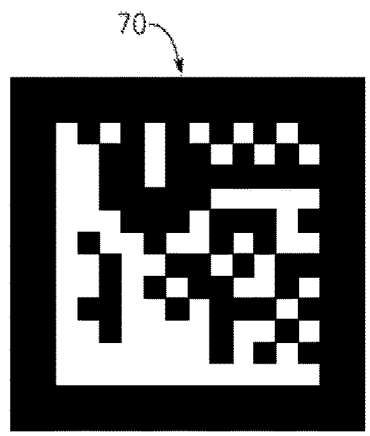
Figure 7:
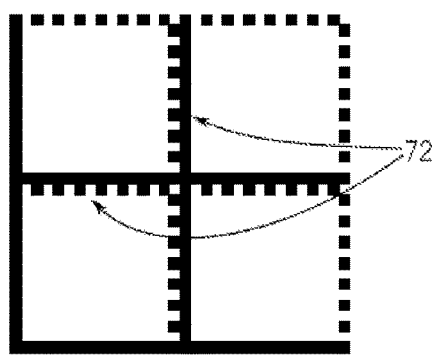

Referring to FIGS. 2-7, a 2D matrix symbol 56 can consist of one or more data regions 58 that contain nominally square symbol modules 60 set out in a regular array. The data region 58 is partially surrounded by a finder pattern 62 that is generally "L" shaped, and the data region 58 can be surrounded on all four sides by a quiet zone 64. A timing pattern 66 provides a count of the number of rows and columns in the symbol 36. FIG. 5 illustrates an example of a dark-on-light 2D matrix symbol 56, and FIG. 6 illustrates an example of a light-on-dark 2D matrix symbol 70. Alignment patterns 72 can also be included, and are typically used with larger grid size symbols (see FIG. 7.)

Machine vision system 30 may use symbol locating software 74 that locates 2D matrix symbols based on its rectangular or square shape or the unique finder pattern 62 and timing pattern 66 to locate promising candidates. In some embodiments, the image acquisition software 44 and the symbol locating software 74 can be combined into one software application, and in other embodiments, the image acquisition software 44 and the symbol locating software 74 can be separate software applications. Either or both the image acquisition software 44 and the symbol locating software 74 can reside and execute on the computer 50 or on the imaging device 42.

One embodiment of a symbol locating algorithm is described in U.S. Pat. No. 7,016,539, which is expressly incorporated herein. Other symbol locating algorithms are available and are contemplated for use. In use, the symbol locating software 74 can locate a symbol candidate by looking for the finder pattern 62 and/or the timing pattern 66 of the 2D matrix symbol. When the data region 58 of a symbol is so damaged that the symbol is not decodable, the symbol locating software 74 may locate multiple promising candidate regions that match the finder and timing patterns to a certain degree. A promising candidate region can be a region of a symbol that is located but is not decodable due to the insufficient amount of usable data in the image. A promising candidate region can be considered promising if more than 65 percent, for example, of the symbol modules 60 match expected finder pattern 62, timing pattern 66, and alignment pattern 72 if it is applicable.

Figure 8:
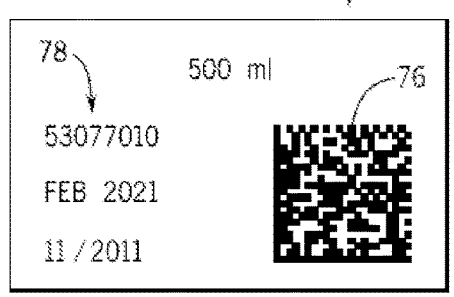
FIG. 8 is a view of a located promising candidate region and background clutter in an image.

Referring to FIG. 8, a promising candidate region 76 can be found using the symbol locating algorithm 74. The remaining symbols 78 in the image 80, e.g., text and numbers, can be considered as background clutter and ignored by the symbol locating software 74 if it does not contain any or enough of the features required to be a 2D matrix symbol, such as a finder pattern 62 and a timing pattern 66. As previously described, the image acquisition software 44 can acquire multiple images, so when a data region 58 of a symbol is so damaged that the symbol is not decodable, the symbol locating software 74 can match multiple promising candidate regions 76 from multiple images. In some embodiments, different image acquisition parameters can be used in the multiple images.

Figure 9:
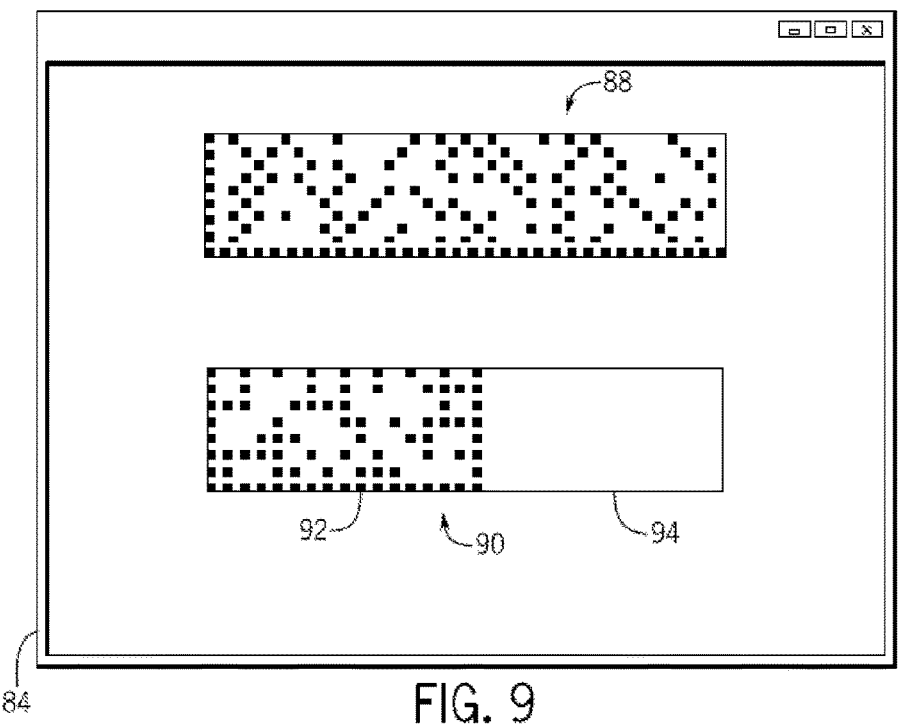
FIGS. 9 and 10 are a first and second image of an object and showing two promising candidate regions.
Figure 10:
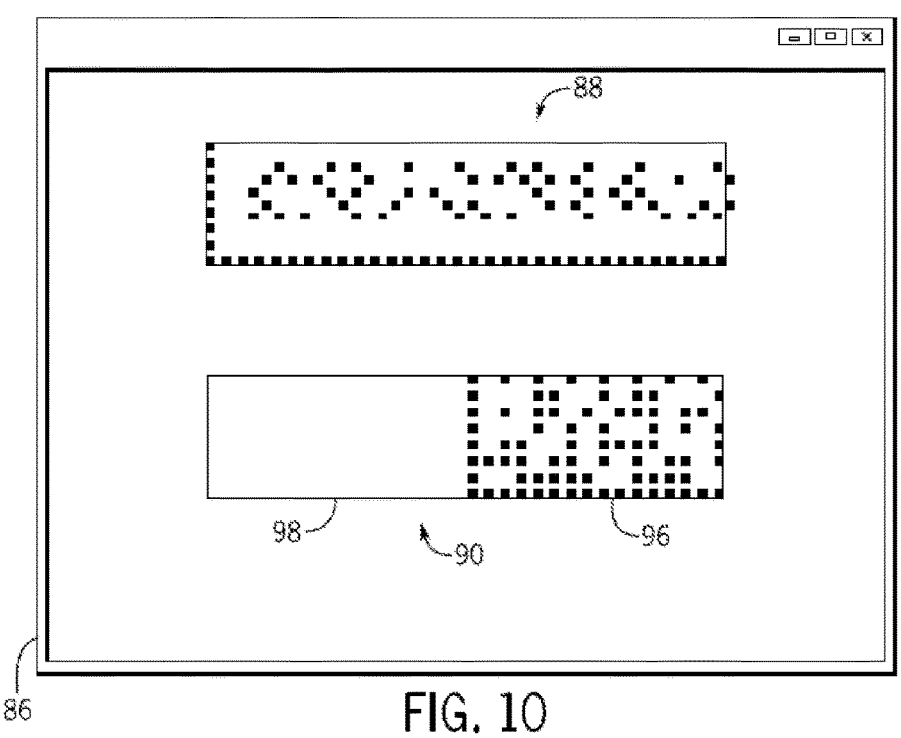

Referring to FIGS. 9 and 10, a first image 84 and a second image 86 are shown. The first image 84 taken of an object shows two promising candidate regions 88 and 90. The second image 86 is another image taken of the same object, and shows the same two promising candidate regions 88 and 90, except, due to some condition, the image data available in the second image 86 is different than the image data available in the first image 84. Image data from these two images 84 and 86, or a plurality of images, can be combined to create decodable data.

As seen in FIG. 9, the symbol locating software 74 can not determine that the promising candidate region 88 is a false promising region because it contains features the symbol locating algorithm is looking for, such as a finder pattern. This false candidate region can be an image of other symbologies or text or textures, for example. The symbol locating algorithm 74 can determine that the promising candidate region 90 is a 2D matrix symbol, which includes a promising data region 92 and a damaged region 94 on its right side (no symbol modules 60 appeared in the damaged region 94).

FIG. 10 shows the second image 86 of the two promising candidate regions 88 and 90. In this second image, the promising candidate region 88 is again a false promising region because it contains features the symbol locating software is looking for but the data modules are not decodable. The symbol locating software 74 can again determine that the promising candidate region 90 is a 2D matrix symbol, which, in the second image 86, includes a different promising data region 96 enclosing a damaged data region 98 on its left side.

In order to combine the promising candidate region 88 from the first image 84 with the promising candidate region 88 from the second image 86, and similarly, the promising candidate region 90 from the first image 84 with the promising candidate region 90 from the second image 86, in an attempt to create decodable data, binary matrices of the two promising candidate regions 88 and 90 are created and "stitched" together using a data stitching algorithm 100. FIGS. 11-16 show the progression of creating and stitching binary matrices of promising candidate regions 88 and 90.

Figure 11:
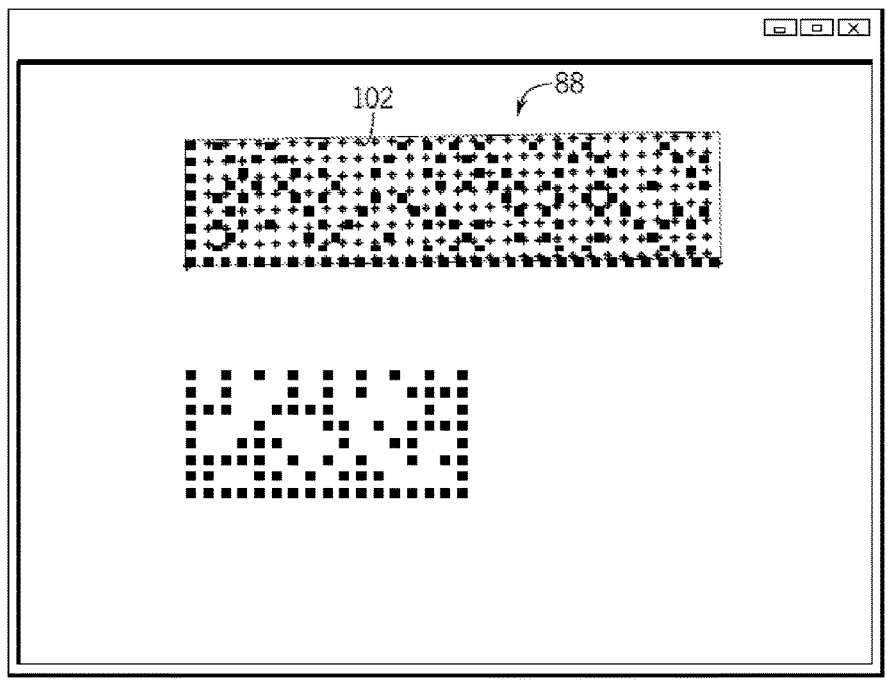
FIG. 11 is an image showing a binary matrix of the first promising candidate in the first image of FIG. 9.
Figure 12:
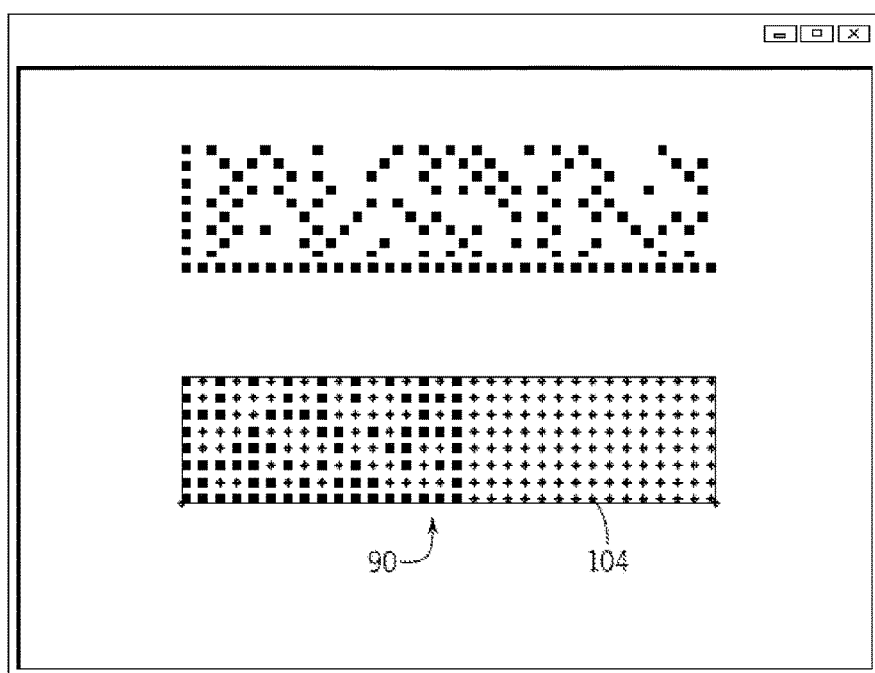
FIG. 12 is an image showing a binary matrix of the second promising candidate in the first image of FIG. 9.
Figure 13:
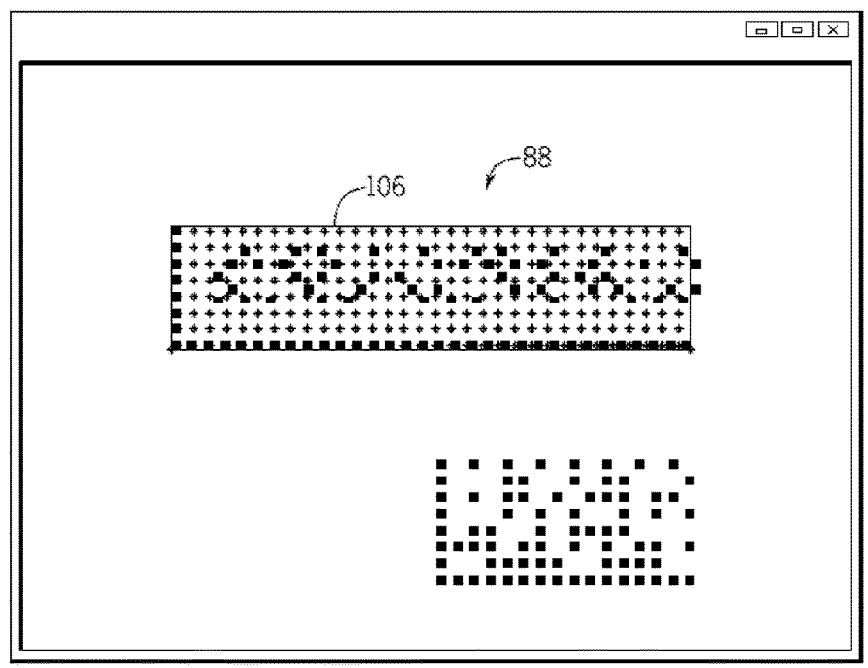
FIG. 13 is an image showing a binary matrix of the first promising candidate in the second image of FIG. 10.
Figure 14:
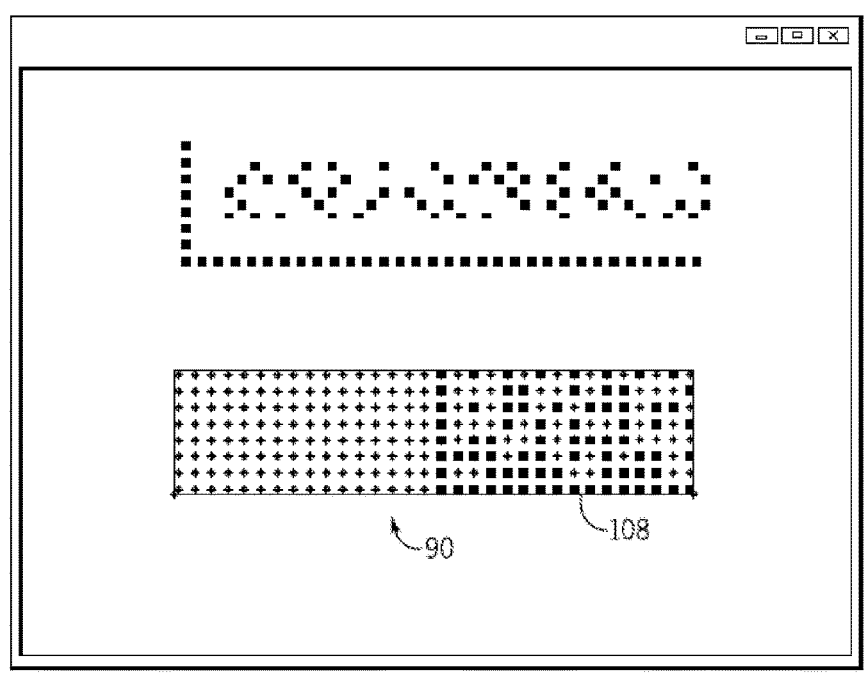
FIG. 14 is an image showing a binary matrix of the second promising candidate in the second image of FIG. 10.

FIG. 11 shows a binary matrix 102 of promising candidate region 88 created from the first image 84. FIG. 12 shows a binary matrix 104 of promising candidate region 90 also created from the first image. Similarly, FIG. 13 shows a binary matrix 106 of promising candidate region 88 created from the second image 86, and FIG. 14 shows a binary matrix 108 of promising candidate region 90 also created from the second image.

Figure 15:
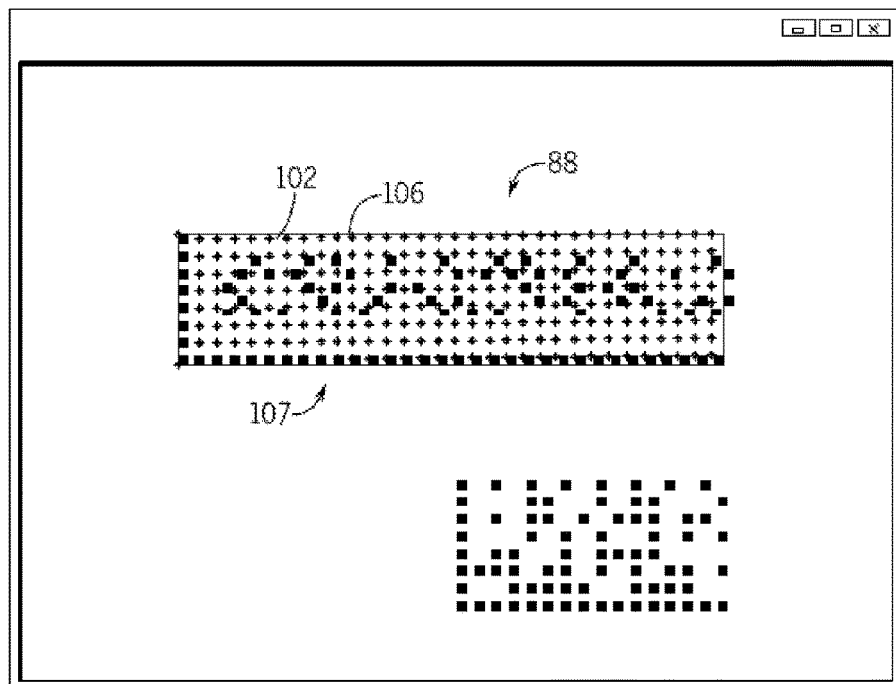
FIG. 15 is an image showing an accumulated binary matrix that stitched the binary matrix of the first promising candidate in the first image of FIG. 9 and the binary matrix of the first promising candidate in the second image of FIG. 10.
Figure 16:
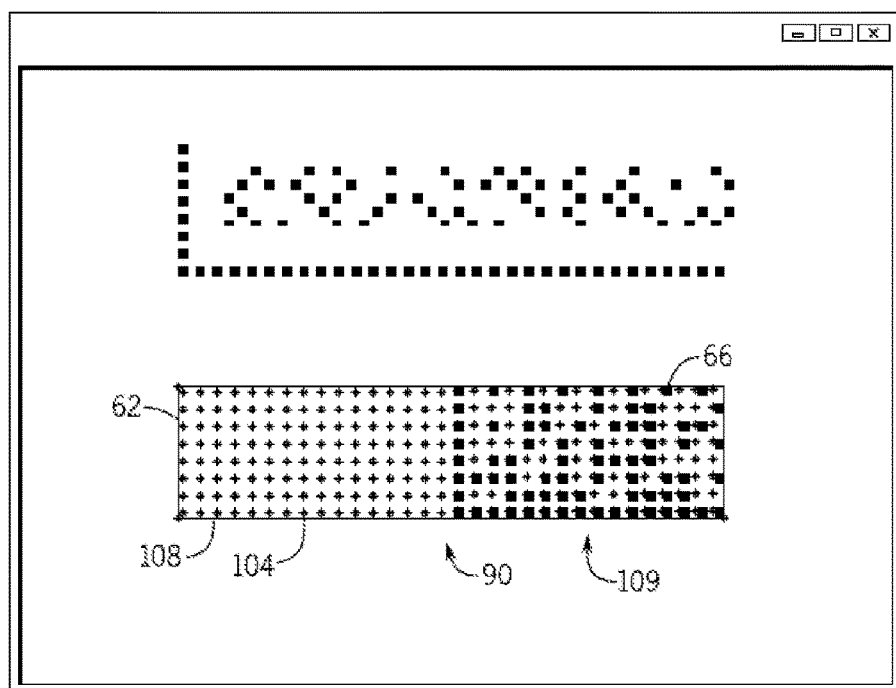
FIG. 16 is an image showing an accumulated binary matrix that stitched the binary matrix of the second promising candidate in the first image of FIG. 9 and the binary matrix of the second promising candidate in the second image of FIG. 10.

FIGS. 15 and 16 show stitched binary matrices developed from both the first image 84 and the second image 86 for both promising candidate region 88 and promising candidate region 90. In FIG. 15, the stitched binary matrices 102 and 106 of promising candidate region 88 from the first image 84 and the second image 88 remain not decodable from the accumulative binary matrix 107. Features such as a finder pattern and/or a timing pattern are not detectable by the symbol locating software 74. Conversely, in FIG. 16, the stitched binary matrices 104 and 108 of promising candidate region 90 from the first image 84 and the second image 86 is decodable from the accumulative binary matrix 109. As can be seen, both a finder pattern 62 and a timing pattern 66 are detectable by the symbol locating software 74.

In some instances, when a plurality of images are acquired of the same symbol, the position of the symbol and/or promising candidate regions of the symbol, may be changed between images. This can be due to changes in illumination, or just as likely, object motion. Embodiments of the technology address changing positions of a symbol in a plurality of images by using a correlation (or other comparison) between a synthetic model of the symbol and available symbol data 110 in a current image of the symbol to find the position association, referred to herein as correspondence. The data stitching algorithm 100 can assume that the change in position can be modeled by using known affine transformation techniques. When the symbol locating software 74 operates on subsequent images (not necessarily the next image or images) acquired on the same object 24, the symbol locating software 74 or the data stitching algorithm 100 can establish the correspondence, e.g., association, between a previously obtained promising candidate region(s) and symbol data 110 in the current image.

Figure 17:
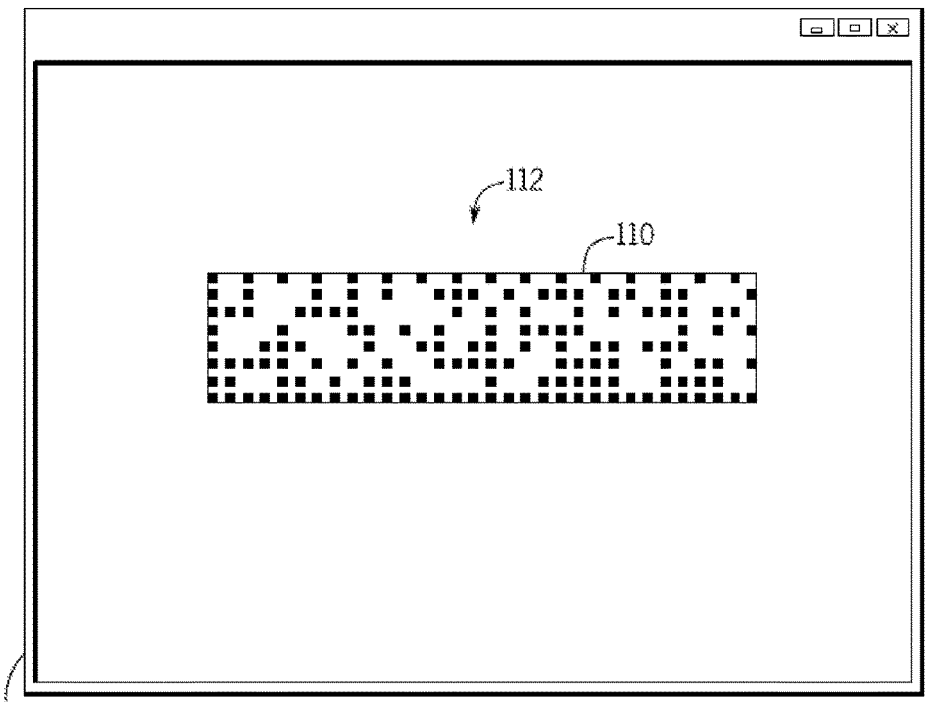
FIG. 17 shows a first image of a symbol.
Figure 18:
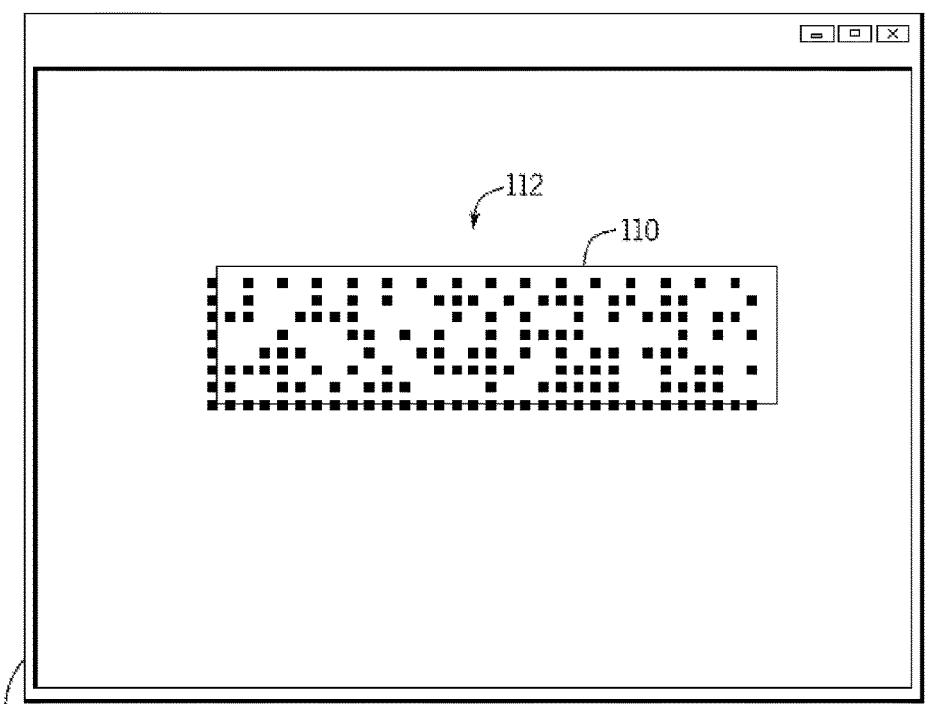
FIG. 18 shows a subsequent, or second image of the same symbol in FIG. 17, and showing the symbol slightly moved.

FIG. 17 shows a first image 114 and FIG. 18 shows a subsequent, or second image 116 of the same symbol 112, where in the second image 116, the symbol 112 has moved (slightly down and to the left) in relation to where the symbol 112 was located in the first image 114. Because of this movement between first and second images 114 and 116, a correlation (or other comparison) between the images is developed.

Figure 19:
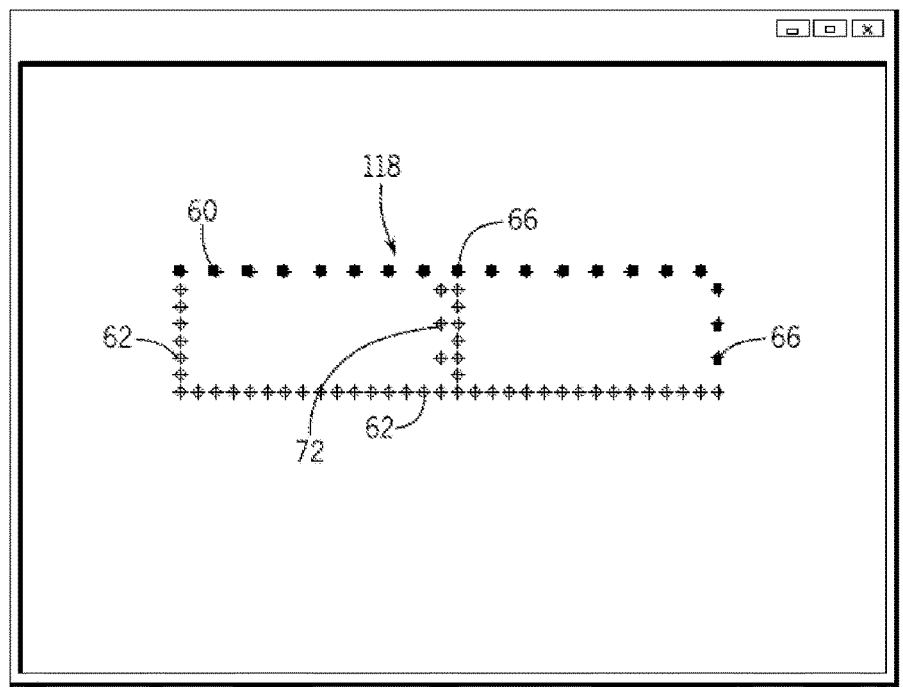
FIG. 19 shows a synthetic model usable with a correlation technique.

Referring to FIG. 19, according to a correlation (or other comparison) technique, a synthetic model 118 can be created using the data stitching algorithm 100. The synthetic model 118 is a model of known features of a particular symbol, in this example a 2D 8×32 matrix symbol. The synthetic model 118 can be generated by using at least one of the known finder pattern 62, timing pattern 66, and possibly alignment pattern 72. The correlation (or other comparison) can be done using known image analysis methods, including a gray level image analysis or a known filtered image analysis, for example. In this example, the dot filter analysis Determinant of Hessian (DOH) was used to produce a set of features, the set of features being enhanced dots 120. DOH is a popular known technology used to enhance dots. Methods to find the correspondence can be expanded to more complicated models, such as perspective models, and polynomial models depending on the application and speed requirements. By using the DOH technology, the known symbol modules 60 should produce a higher DOH response. The set of features can vary for different applications.

Figure 20:
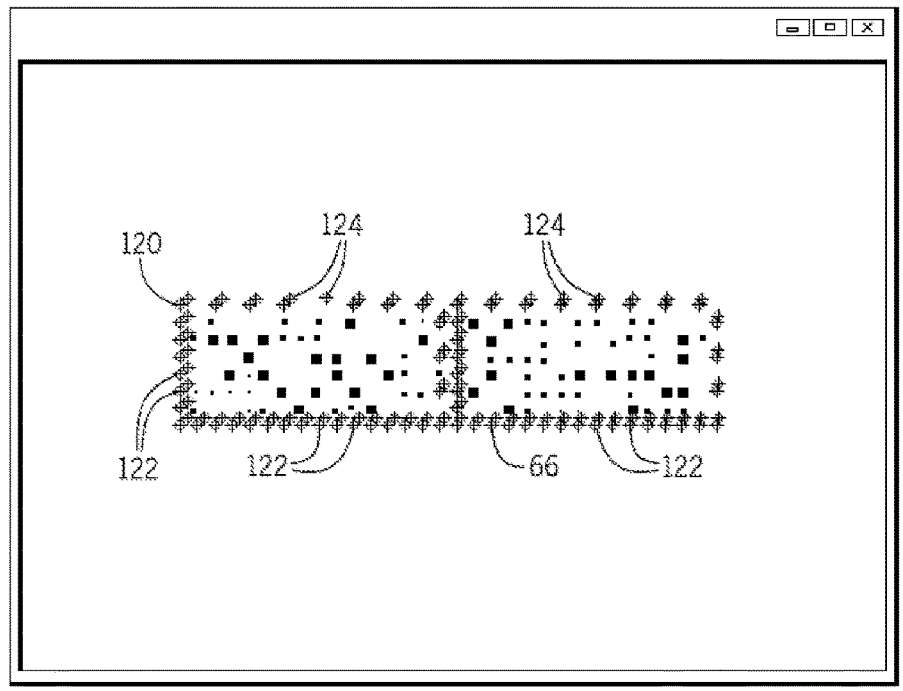
FIG. 20 shows the symbol position for which the correlation between the synthetic symbol model and the second image is the highest within a parameter space of scale and position.
Figure 21:
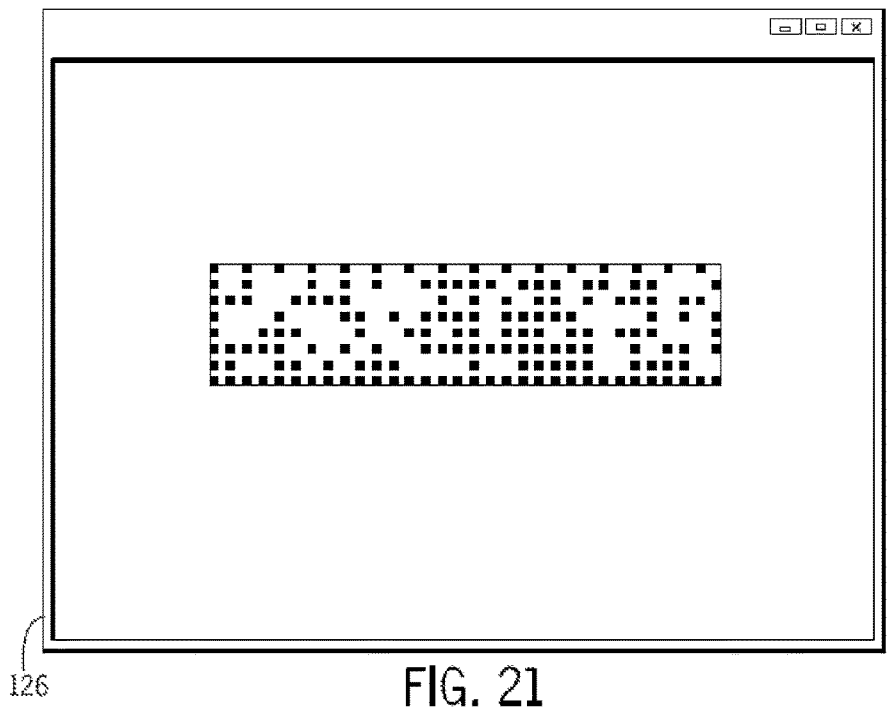
FIG. 21 shows a refined promising region in the second image.

Referring to FIG. 20, by using the correlation (or other comparison) technique, the correspondence between the synthetic model 118 and the moved second image 116 can be found. The correspondence can be established by maximizing a correlation score in a parameter space including scale, angle and translation. The shifted set 122 of symbol modules 66 show a higher DOH response than the modules positions 124 estimated from the first symbol region in the first image 114, indicated the correlation to the synthetic model 118 is higher. The shifted set 122 are the new module positions estimated from correlating the synthetic model 118 with the DOH response. Finally, with the correlation to the synthetic model 118 established, the second image 116 can be refined according to the correlation to produce a refined promising region 126, as seen in FIG. 21. With the new refined second image 126, the data stitching algorithm 100 can be used to stitch together the data matrix from the first image 114 and the data matrix from refined promising region 126, as previously described above. The confidence of each sampling point, a sampling point being a symbol module 66, can be obtained and a corresponding accumulative binary matrix 109 (such as shown in FIG. 16) can be updated until the accumulative binary matrix 109 result is able to be decoded.

Figure 22:
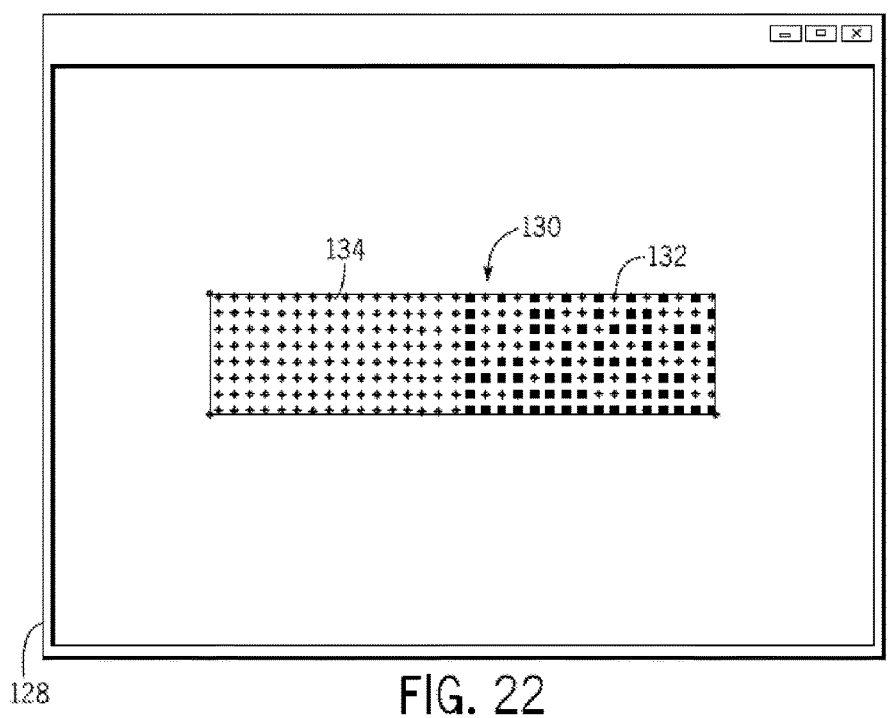
FIG. 22 shows a first image of a symbol using a bright field illumination with a promising candidate region enclosing a damaged data region.
Figure 23:
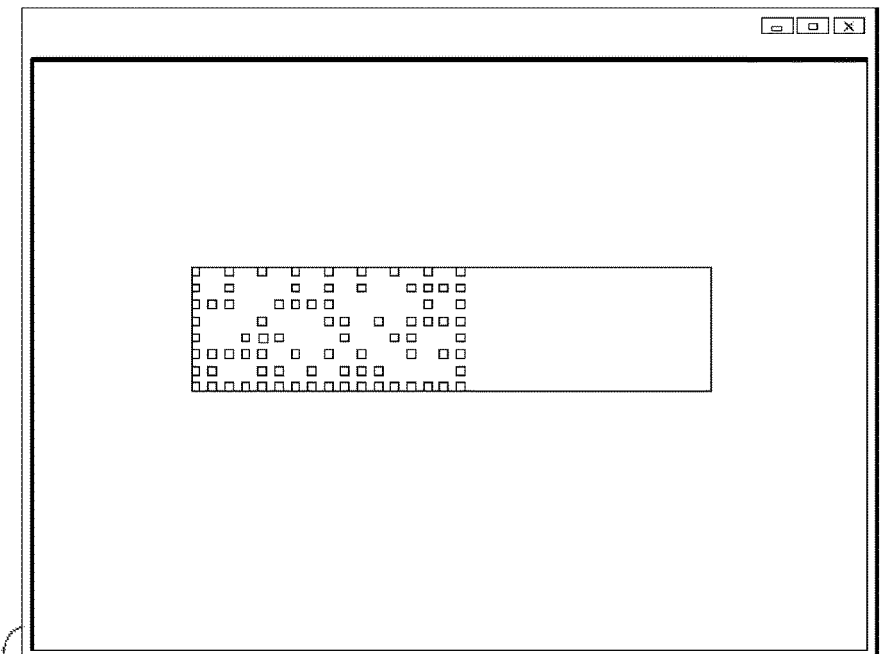
FIG. 23 shows a second image of the symbol of FIG. 22 with an unknown polarity.

In some embodiments, the data stitching algorithm 100 can analyze images with the same or opposite polarities. FIG. 22 shows a first image 128 of a symbol 130 using a bright field illumination with a promising candidate region 132 and a damaged region 134 on the left side. When a second image 140 (see FIG. 23) is acquired and the polarity of the second image is unknown, the data stitching algorithm 100 can be used to determine the polarity of the second image 140 by analyzing a promising candidate region in the second image.

Figure 24:
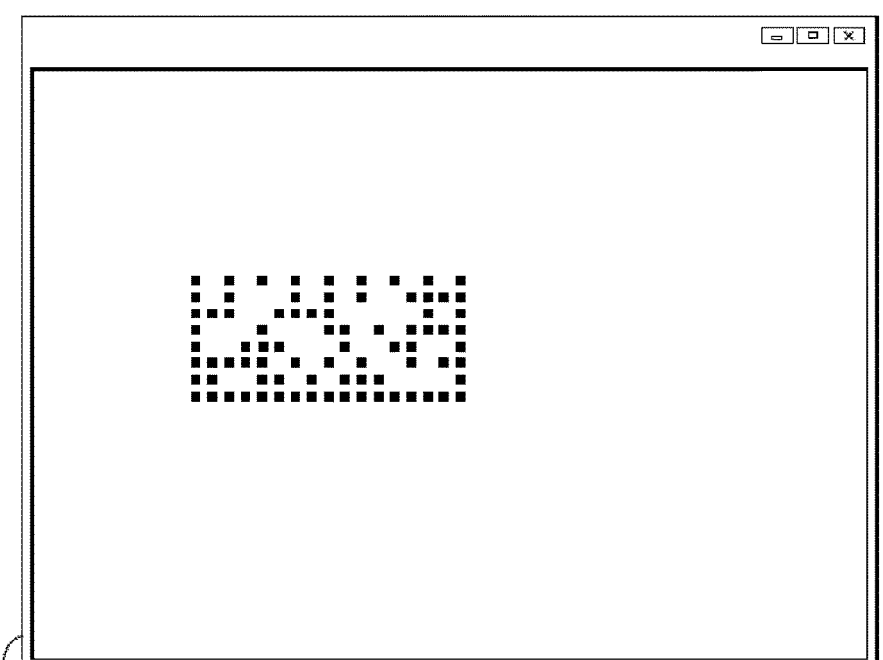
FIG. 24 shows a first DOH image using a light-on-dark filter.
Figure 25:
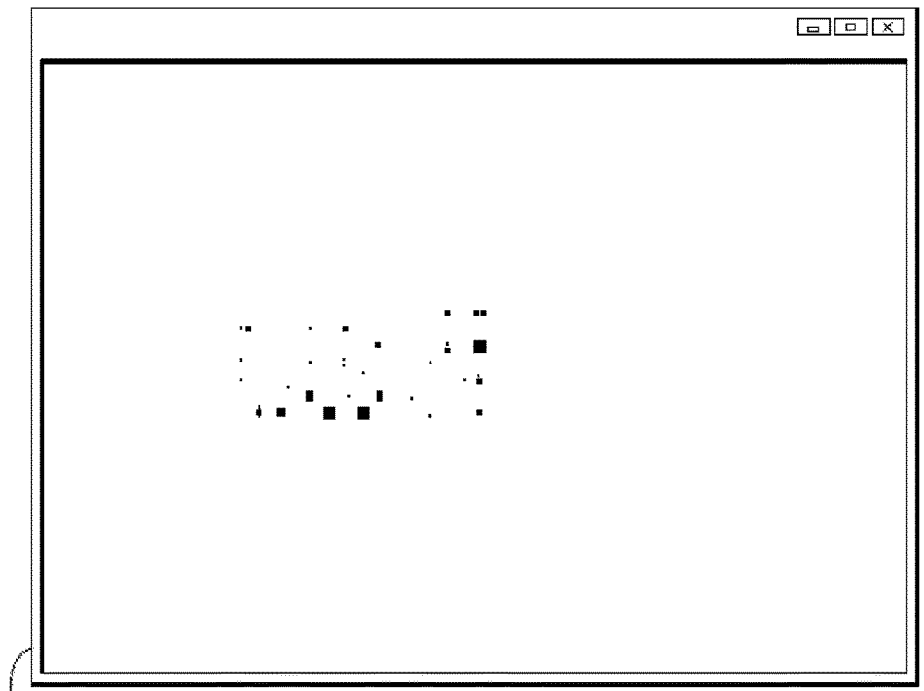
FIG. 25 shows a second DOH image using a dark-on-light filter.

Referring to FIGS. 24 and 25, two DOH images are generated using the second image 140, a first DOH image 136 using a light-on-dark filter (FIG. 24) and a second DOH image 138 using a dark-on-light filter (FIG. 25). Then, as previously described above, a correlation based method can be applied to both the first DOH image 136 and the second DOH image 138 to find the correspondence in both DOH images 136 and 138. In this example, the correlation score from the first DOH image 136 using the light-on-dark filter is higher than the correlation score from second DOH image 138 using the dark-on-light filter. Based on the higher correlation score for the first DOH image 136 using the light-on-dark filter, the data stitching algorithm 100 determines the polarity of the analyzed second image 140 to be light-on-dark.

Figure 26:
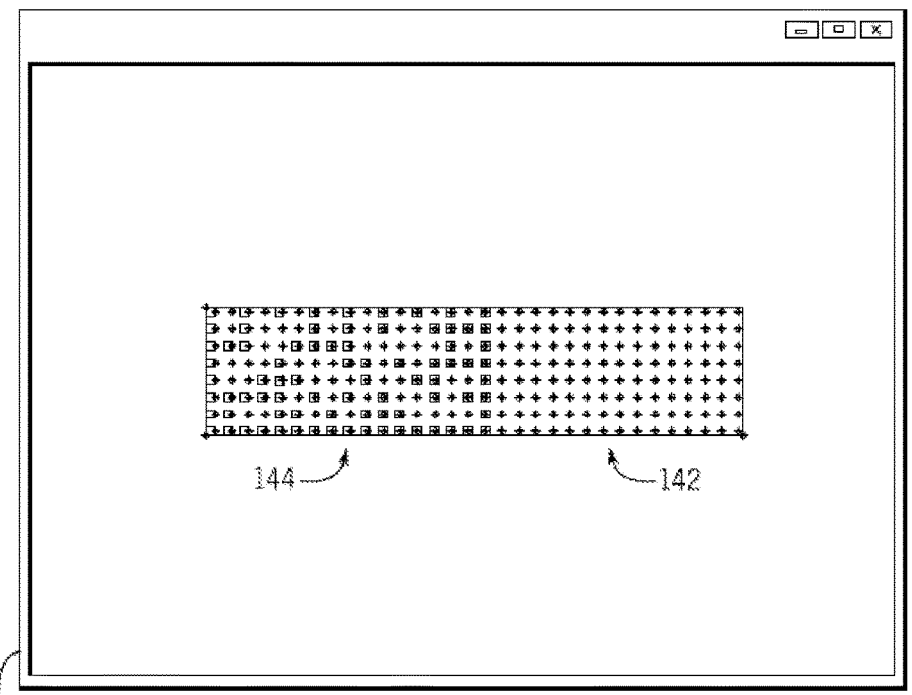
FIG. 26 shows the decodable stitched and accumulated binary matrices from the first image of FIG. 22 and the second image of FIG. 23.

With the polarity determined, the data stitching algorithm 100 can proceed to stitch together the data matrix from the first image 128 and the data matrix from the analyzed second image 140, as previously described above. FIG. 26 shows an image 146 of the decodable stitched and accumulated (or otherwise at least partly combined) binary matrices 142 and 144 from the first image 128 and the second image 140, respectively.

In some machine vision systems, such as the machine vision system 30, different image acquisition settings, such as exposure times or light settings, may be available for image acquisition. Generally, light settings can specify various characteristics of lighting for a particular image acquisition, including bright field and dark field settings, power ranges (e.g., as applied for bright field or dark field settings), polarity values, and so on. Various examples herein address light settings as example image acquisition settings for various read cycles. In other embodiments, other image acquisition settings, such as exposure times or other settings, may additionally (or alternatively) be utilized.

Depending on various factors, including environmental factors in the relevant workspace, obstruction or shadowing of images by robotic or other devices, and so on, images acquired using particular image acquisition (e.g., light) settings may sometimes contribute more readily to successful decoding attempts than images acquired using other image acquisition settings. It may be useful, accordingly, to provide a method or system for prioritizing image acquisition settings (and, accordingly, images acquired with those image acquisition settings) for use in a decoding attempt or series of decoding attempts. In some implementations, this can include, for example, a method or system for sorting an acquisition settings table, and determining, based at least partly on the sorted order of the table, a prioritized order for image acquisition settings for a subsequent attempt to decode images. For example, an imaging manager (e.g., a manager module in a program for imaging and analyzing symbols on semiconductor wafers) can be configured to determine a preferential order of image acquisition settings for image analysis, such that images can be selected for decoding attempts based on the place of the image acquisition settings used to acquire the images within the preferential order.

In some implementations, image acquisition (e.g., light) settings can be stored within an acquisition settings table with a plurality of entries. In such a case, for example, each entry of the acquisition settings table can include at least an image acquisition (e.g., light) setting field, which can specify the particular image acquisition settings (e.g., particular light mode, image exposure, image gain, or image offset) associated with the corresponding entry of the acquisition settings table.

In some implementations, a particular numerical or alpha-numerical code can be used in the image acquisition setting field to designate a particular light setting (or other setting) for the corresponding table entry. For example, light mode codes such as BF1, BF2 and BF3 can be used to specify particular bright field modes, light mode codes such as DF1, DF2, DF3, DF4, DF5 and DF6 can be used to specify dark field modes, and light power values can be specified within a particular numerical range (e.g., between 0.0 and 127.0). In some implementations, an index value (e.g., 1, 2, 3, 4, 5, and so on) can be used for the image acquisition setting field of various entries, which a particular index value corresponding to a particular image acquisition setting (e.g., a particular light setting such as a particular bright or dark field mode, polarity, and power setting). In such a case, for example, a separate look-up table can specify the particular image acquisition (e.g., light) settings that correspond to particular index values.

In some implementations, a sequence of images, each with a particular image acquisition (e.g., light) setting, can be acquired by an imaging system (e.g., the machine vision system 30). This may be useful in a variety of circumstances, including during initial set-up or subsequent training or calibration of an imaging system. For example, when a wafer identification system is being set-up for operation, it may be useful for the system to capture images using a number of different image acquisition (e.g., light) settings, such that it can be determined whether particular image acquisition settings contribute more reliably to successful decoding of acquired images.

In some implementations, a sequence of image acquisition (e.g., light mode) settings for subsequent image decoding (i.e., an "updated order" for the image acquisition settings) can be specified, based upon the ordering of entries in an acquisition settings table. For example, for an attempt to decode a symbol using a set of ten images, the imaging manager can determine an updated order for image acquisition (e.g., light mode) settings values that corresponds to the image acquisition (e.g., light mode) setting fields in the first ten entries of a sorted acquisition settings table. Ten images for the decoding attempt can then be selected (and, in some cases, acquired) such that the images exhibit, in order, corresponding image acquisition (e.g., light mode) settings from the acquisition settings table. For example, a first image can be selected based on the image having been acquired using a first image acquisition (e.g., light mode) setting from the sorted order of the acquisition settings table, a second image can be selected based upon having been acquired using a second image acquisition (e.g., light mode) setting from the sorted order of the acquisition settings table, and so on. In other implementations, other orders or ways of designating of an image acquisition (e.g., light mode) setting for a particular image (or images) may also be possible.

Figure 27:
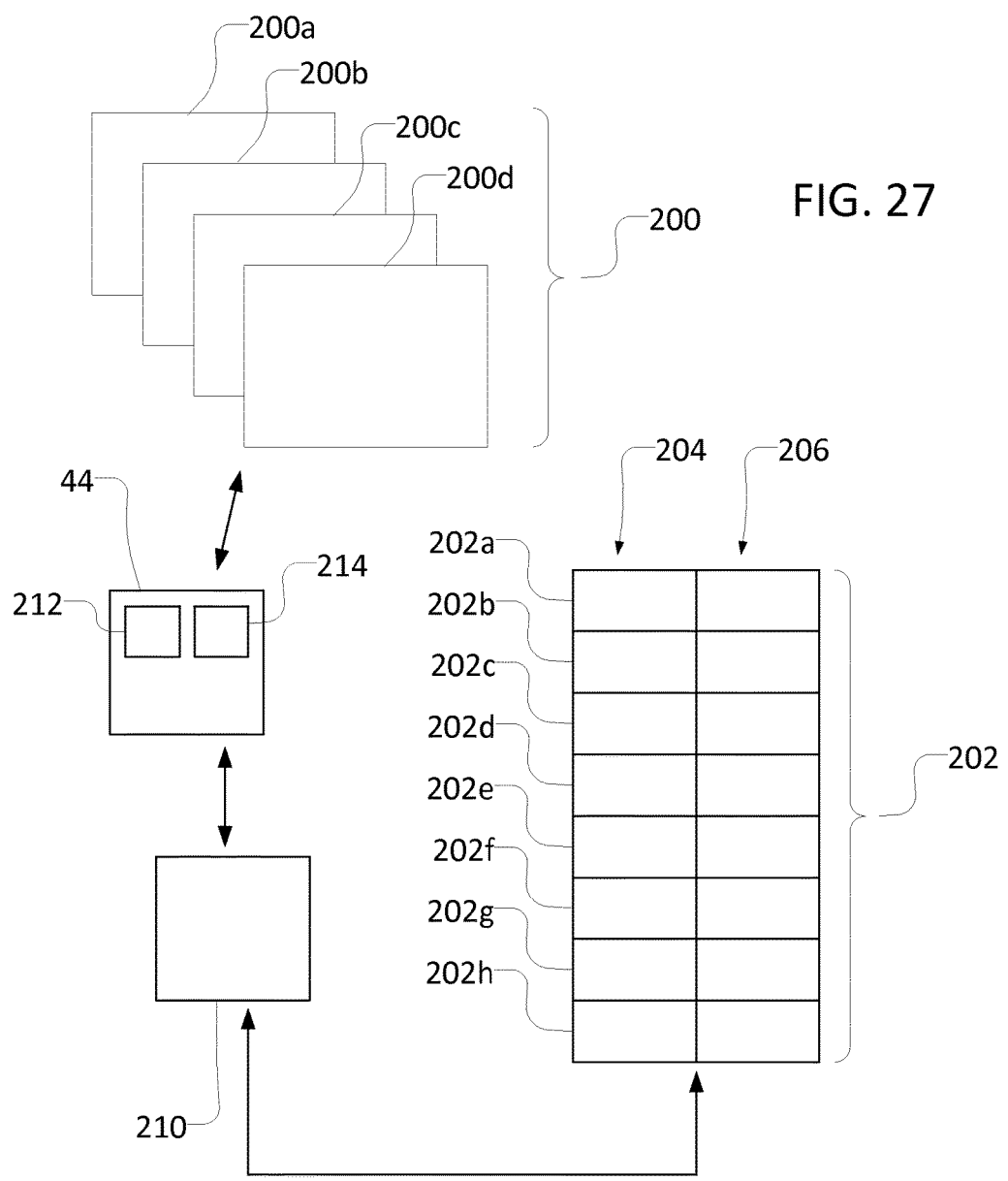
FIG. 27 is a schematic view of an image acquisition and point allocation operation, with an acquisition settings table.

In some implementations, the sorting of an acquisition settings table can be implemented based upon decoding (or other processing) attempts on already-acquired images, with the resulting sorted order of the acquisition settings table being used to specify an updated order of image acquisition (e.g., light) settings for subsequent image analysis. Referring to FIG. 27, for example, a set 200 of images (e.g., images 200a, 200b, 200c, 200d, and so on) can be acquired by the machine vision system 30. Each of the images of the set 200 can be acquired with a particular light setting. For example, an imaging manager 210 can operate to access an acquisition table configured as a light settings table 202 and communicate a set or sequence of light settings from the table 202 to an image acquisition system (e.g., various modules of the image acquisition software 44). The image acquisition system can then direct sequential (or other) acquisition of the set 200 of images using the light settings specified by the imaging manager 210.

In some implementations, the set 200 of images can be captured for use with a particular read cycle (i.e., a particular set of operations for decoding a symbol at least partly included in the images) for the machine vision system 30. Accordingly, in some implementations, all of the images in the set 200 can be processed together, in various ways and combinations. In other implementations, the set 200 of images can be captured for use with different read cycles and the images can accordingly be processed separately, in various ways and combinations.

Generally, the light settings table 202 may be configured in various ways, can include various types of data in addition to light settings data (e.g., other image acquisition settings data), and can be included in (or be accessible by) the image acquisition software 44 (or another program or module). As depicted, the light settings table 202 includes a set of entries 202a through 202h, each including at least a light setting field 204 and a sorting values field 206. Generally, values in the light setting field 204 of various entries in the table 202 specify particular light settings (e.g., dark/bright field, power, and so on) and values in the sorting values field 206 specify a value for sorting the table 202 (e.g., based on ascending or descending order of the values in the sorting values field 206). In other implementations, other configurations of the table 202 may be possible, including configurations with additional fields.

In the system depicted, the imaging manager 210 can operate to access the light settings table 202 in order to communicate light settings (or other image acquisition settings) from the light settings table 202, as specified by the light setting field 204 (or other fields), to the image acquisition software 44 (or another aspect of the machine vision 30, generally). In this way, the image acquisition software 44 (or another system) can determine particular light settings (or other image acquisition settings) for the acquisition, respectively, of the various images of the set 200. Similarly, images acquired with the image acquisition software 44 may be tagged in various ways (e.g., with metadata associated with the images) to indicate the particular light settings (or other image acquisition settings) used to acquire the images.

For example, images acquired with light settings from the table 202 may be tagged with a value representing the associated entry of the light setting field 204 (e.g., an index value or a value otherwise representing the relevant light setting).

The imaging manager 210 can communicate the light settings (or other image acquisition settings) from the table 202 sequentially, as an ordered set of light settings, or otherwise, such that the imaging manager 210 can specify an acquisition (or other) order for the light settings (or other image acquisition settings), as well as the parameters of the light settings (or other image acquisition settings) themselves (e.g., power, bright or dark field, and so on), or otherwise associated a particular light setting (or other image acquisition setting) with a particular image. As depicted, for example, the sorting values field 206 can indicate a depicted sorted order for the table 202, with entry 202*a* at the top of the table 202 and the entries progressing, in order, to entry 202*h* at the bottom of the table 202. Accordingly, based on communication with the imaging manager 210, the image acquisition software 44 can determine that the first four light settings of the table 202 (i.e., as indicated by the values for the entries 202*a* through 202*d* of the light setting field 204) should be utilized, respectively, for acquisition of the first four images 200*a* through 200*d* of the set 200, or that the first four light settings of the table 202 correspond to the light settings used for acquisition of the first four images 200*a* through 200*d*.

Each of the images of the set 200 (or a subset thereof) can then be processed by the image acquisition software 44, in an attempt to decode symbol(s) (e.g., text characters or two-dimensional matrix symbols such as Data Matrix symbols) that are included on one or more images in the set 200. Various tools can be used to decode the symbol(s) of the images in the set 200. In some implementations, for example, the decoding processing can employ a tool for decoding a two-dimensional matrix symbol (e.g., an algorithm for decoding Data Matrix symbols). In some implementations, the decoding processing can employ an optical character recognition ("OCR") tool (e.g., an OCR algorithm) for decoding text. In some implementations, multiple tools may be used. For example, processing the images of the set 200 to attempt to decode a symbol in the images can include processing the images with both a two-dimensional matrix symbol decoding tool and an OCR tool. Various images (e.g., the images 200*a* through 200*d*) can be processed for decoding sequentially, or in parallel, with a Data Matrix decoding tool 212 and with an OCR decoding tool 214. In some implementations, processing for decoding can be implemented in parallel with active image acquisition.

In some implementations, the processing of the images of the set 200 can include individual processing of a subset of the images in the set 200 with a particular tool (e.g., a particular algorithm). In some implementations, a read cycle for a particular tool can include processing of multiple images, including separate processing of multiple images, and collective processing of various combinations of images (or information contained therein or derived therefrom). For example, as described in greater detail above, data from multiple images can be stitched together for collective processing, such that multiple images can contribute to decoding of a particular symbol.

Various discussion herein may address examples of stitching data from multiple images. In some implementations, however, other analysis of multiple images may also be used. For example, some images may be analyzed to decode symbols based upon stitching together the images themselves. It will be understood that, unless otherwise limited or specified, the discussion herein of prioritizing particular image acquisition settings may be applied in a variety of operations, including sets of image capture and symbol decoding operations that employ stitching of images themselves, rather than (or in addition to) stitching of data from images.

Following the execution of a particular read cycle (e.g., processing to attempt to decode a symbol on one or more images of the set 200), point values can be assigned to particular images (and thereby associated with the image acquisition setting used to capture those images) based upon the processing of the images in the read cycle. Generally, such point values can be assigned from a predefined number of total points, with all of the number of total points being assigned among a particular set of images. For example, where 1000 total points are available for assignment, all of the 1000 points can be assigned among a set of images, with different images of the set receiving different assignments of numbers based upon the contribution of the particular image to the decoding operation.

In some implementations, points may be assigned to images that have been used by a particular tool to successfully decode a symbol during a read cycle. For example, if the OCR tool 214 successfully decodes a symbol during a read cycle that includes analysis of each of the set 200 of images (or a subset thereof), a predefined number of total points (e.g., 1000 points) can be assigned among the images of the set 200 (or subset thereof), such that all of the predefined total points are assigned to the entire set 200 of images (or subset thereof). Points may be assigned by the imaging manager 210, in some implementations, or by other software, modules, hardware, and so on.

Where only a single image is utilized for a successful read cycle or decoding attempt (e.g., when a "singleton" results in a successful decode), all of the predefined number of total points can be assigned to the single image. Where multiple images are utilized for a successful read cycle, point values can be assigned among the multiple images in various ways, including in relative proportion to the contribution of particular images to the successful decode. In some implementations, for example, one decoding attempt for the set 200 of images can include stitching together data from the images 200*a*, 200*b*, and 200*c* for collective processing to decode a common symbol. If the image 200*a* is used as a primary image for the decoding processing and the images 200*b* and 200*c* are used as secondary images for the decoding processing, half of the available points (e.g., 500 points) can be assigned to the image 200*a* and the remaining points divided between the images 200*b* and 200*c* (e.g., with 250 points being assigned to each). Generally, point values may be assigned among multiple images based on various factors, such as how much of the symbol content of the respective images can be reliably identified by the read cycle analysis.

In some implementations, certain images processed as part of a read cycle may not contribute to a successful decoding of a symbol. For example, still referring to FIG. 27, another decoding attempt for the set 200 of images can include the stitching together of data from the images 200*a*, 200*b*, 200*c*, and 200*d*, in various combinations, for decoding processing. If the image 200*a* is used as a primary image for the decoding processing, the images 200*b* and 200*c* are used as secondary images for the decoding processing, and the image 200*d* does not contribute to the success of the decoding processing, half of the available points (e.g., 500 points) can be assigned to the image 200*a*, the remaining points can be divided between the images 200*b* and 200*c*

(e.g., with 250 points being assigned to each), and minimal impact (e.g., zero) points can be assigned to the image 200d. Similarly, if none of the images 200a through 200d contribute to success of the decoding processing (e.g., if the read cycle does not successfully decode a symbol for any data stitching combination of the images 200a through 200d), minimal impact (e.g., zero) points can be assigned to each of the images 200a through 200d.

Where multiple tools contribute to a successful decoding of a symbol during a successful read cycle, the predefined number of total points can be reduced in proportion to the number of tools. In some implementations, for example, two tools can be used for a particular read cycle. Accordingly, the points available for assignment to images processed by either tool can be reduced by half such that the number of total points can be distributed between both of the tools. For example, if the OCR tool 214 successfully decodes a symbol in a particular read cycle by stitching data from the images 200a through 200c and the Data Matrix tool 212 successfully decodes the symbol by stitching data from the images 200c and 200d, the total number of points available for assignment to the images for each of the tools can be reduced by half from the total number of points that would be available if only one of the tools had successfully decoded the symbol. As such, for example, half of the total points (e.g., 500 points) may be available for assignment to the images 200a through 200c, based on the results of the decoding with the OCR tool 214, and half of the total points (e.g., 500 points) may be available for assignment to the images 200c and 200d, based on the results of the decoding with the Data Matrix tool 212.

In some implementations using multiple tools, points may not be assigned to particular images unless a successful decode attempt has been made for at least two of the tools. For example, where the system 30 is configured to implement an OCR and Data Matrix decoding, point values may sometimes be assigned to images only if both of the tools decode a symbol successfully. In such a configuration, for example, if an OCR tool successfully decodes a symbol during a read cycle, but a Data Matrix tool does not, no points may be assigned to any of the processed images. In other implementations using multiple tools, points can be assigned for tools that have successfully decoded a symbol but not for tools that do not successfully decode a symbol.

Once points have been assigned based on the decoding attempts, the table 202 can then be updated (e.g., by the imaging manager 210). In some implementations, in order to prioritize the use of light settings (or other image acquisition settings) that previously contributed to successful decoding attempts (e.g., during successful read cycles), the sorted order of the table 202 can be updated based on past decoding results. This may be accomplished in a variety of ways.

In some implementations, for example, an average such as an exponential moving average ("EMA") can be calculated (e.g., by the imaging manager 210) for various entries of the sorting values field 206 and the points that were assigned to corresponding images, following a successful read cycle. For example, where the points assigned to the various images are appropriately scaled to correspond to values of the sorting values field 206 for entries of the table 202, the assigned points can be considered as new data for the sorting values field 206 such that an EMA may be readily calculated. More specifically, the points assigned to a particular image can be treated as new data for the sorting values field 206 at an entry of the table 202 that corresponds to the light setting used to capture that image. An EMA may then be calculated for the assigned points and the corresponding entries of the sorting values field 206 of the table 202, and the sorting values field 206 can updated with the resulting EMA values.

Still referring to FIG. 27, for example, when the light setting indicated by the light setting field 204 for the entry 202a of the table 202 is used to acquire the image 200a, the points assigned to the image 200a after processing of the image 200a for a decoding attempt can be associated with the sorting values field 206 for the entry 202a. When an EMA (or other average) is calculated, the point value for the image 200a can accordingly be treated as new data for the sorting values field 206 for the entry 202a, such that an EMA for the field 206 can be calculated in conventional ways. For example, an EMA for a particular sorting values field may be calculated as:

$$EMA = (P \cdot \alpha) + (SVF_c \cdot (1-\alpha)), \quad (1)$$

where $SVF_c$ represents the current value of a relevant entry of the sorting values field 206, P represents the corresponding assigned points, and a represents a smoothing factor, which can be calculated, for example, based upon a particular number of images for a relevant cycle.

Similar calculation of EMAs (or other averages) can also be executed for other entries of the sorting values field 206 (e.g., each other entry, or each entry for which a point value has been assigned to a corresponding image). In this way, for example, light settings (or other image acquisition settings) that are used to acquire images that contribute to a successful read cycle can be provided with an increased value in the associated entry of the sorting values field 206. Similarly, light settings (or other image acquisition settings) that are used to acquire images that do not contribute to a successful read cycle can be provided with a decreased value in the associated entry of the sorting values field 206.

Once EMAs (or other averages) have been calculated for appropriate entries of the sorting values field 206, using the corresponding assigned points as new data for the EMAs, the entries of the sorting values field 206 can be updated with the new EMA values. In some implementations, the table 202 can then be sorted at least partly based on the EMA values (i.e., based on the current values of the sorting values field 206). Updating of the sorting values field 206 and sorting of the table 202 can be accomplished by the imaging manager 210, or by other software, modules, hardware, and so on.

In some implementations, the table 202 can be sorted (i.e., can be updated to a new sorted order) based on the values of the sorting values field 206, such that light settings (or other image acquisition settings) that contribute to successful decoding can be advanced in the sorted order and light settings (or other image acquisition settings) that do not contribute to successful decoding can be moved downward in the sorted order. In this way, for example, when images are selected (or acquired) for subsequent decode attempts, images acquired with particular image acquisition (e.g., light) settings that have previously contributed to successful decoding attempts can be prioritized over images acquired with image acquisition (e.g., light) settings that may have been less successful.

Figure 28:
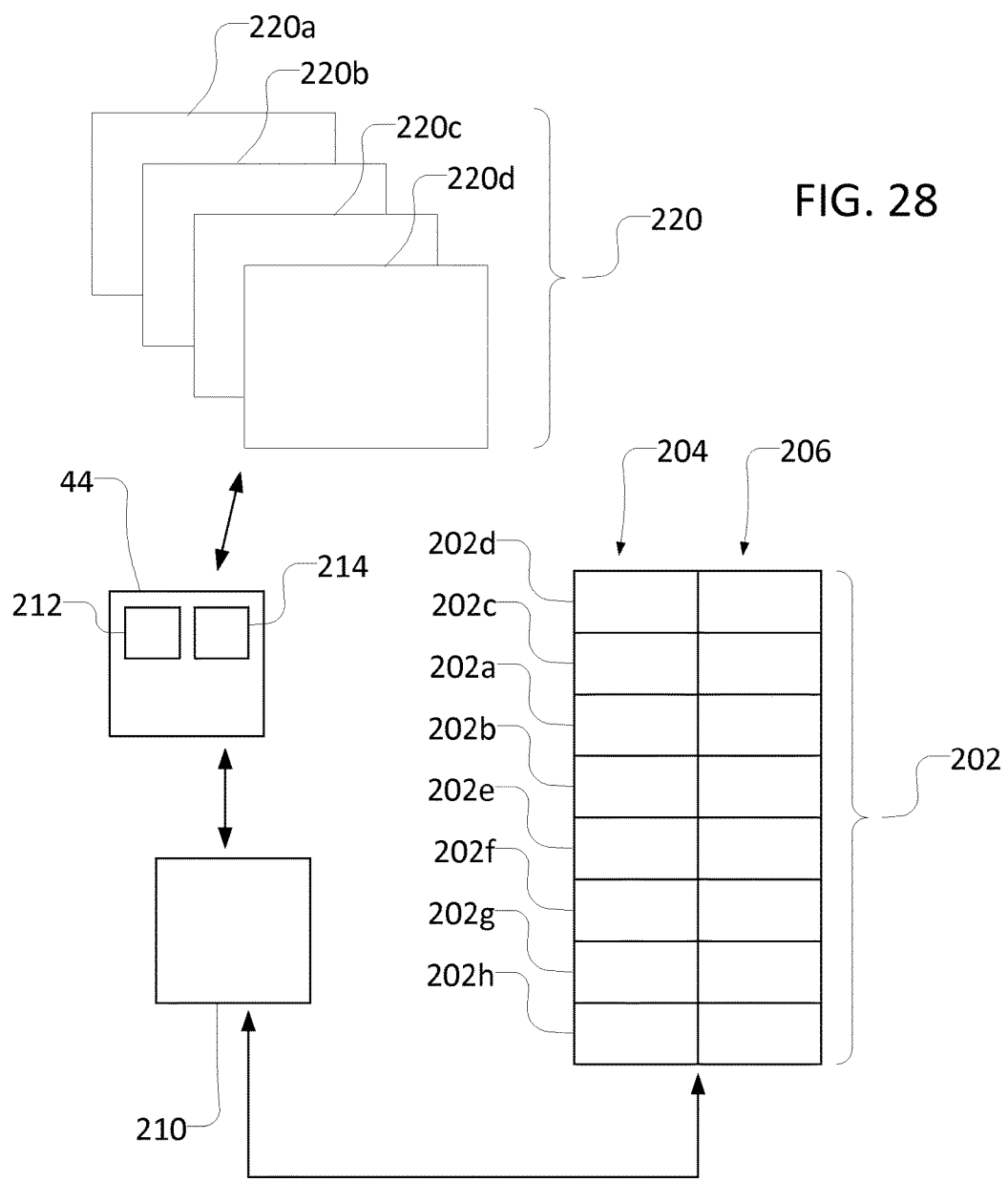
FIG. 28 is a schematic view of another image acquisition operation, with the acquisition settings table of FIG. 27 sorted according to one embodiment of the disclosure.

Referring also to FIG. 28, for example, if the images 200c and 200d (see FIG. 27) contribute to successful decoding and the images 200a and 200b (see FIG. 27) do not, the images 200c and 200d can be assigned more points than the images 200a and 200b. Therefore, after the calculation of EMAs and updating of the sorting values field 206, a re-sorting of the table 202 to a new sorted order, based on the sorting values field 206, can place the light settings for the images 200c and 200d (i.e., as reflected in the light setting field 204 for the entries 202c and 202d) ahead of the light settings for the images 200a and 200b (i.e., as reflected in the light setting field 204 for the entries 202a and 202b). Accordingly, the light settings for the images 200c and 200d can be prioritized over the light settings for the images 200a and 200b in a subsequent image decoding attempts (of the same or a different symbol) or other operations. It will be understood, however, that this particular sorted order (i.e., with light settings for the images 200c and 200d ahead of the light settings for the images 200a and 200b) may not necessarily be obtained, depending on the results of the various EMA calculations and various other factors.

In other implementations, other sorting algorithms or procedures may be used. Further, it will be understood that sorting of the table 202 can include virtual sorting of the table 202 via reference to the various entries of the sorting values field 206, rather than a physical rewriting of the table entries to different memory locations, or a combination of virtual sorting and physical rewriting of table entries.

Once a sorted order of the table 202 has been updated (e.g., once the table 202 has been sorted based on the EMA calculations described above), a new decoding attempt can be made, with light settings (or other image acquisition settings) for images used in the new decoding attempt being prioritized based on the updated sorted order of the table 202. As described above, for example, the imaging manager 210 can access the light settings table 202 in order to communicate light settings from the light settings table 202, as specified by the light setting field 204, to the image acquisition software 44 for processing of another set of images 220. However, in contrast to the sorted order of light settings for the set 200 of images (see FIG. 27), the updated sorted order of the table 202 now indicates that the light settings (or other image acquisition settings) for the table entry 202d should be used first, followed by the light settings (or other image acquisition settings) for the table entry 202c, then the light settings (or other image acquisition settings) for the table entries 202a and 202b. As such, the image acquisition software 44 may first attempt to decode an image 220a of the set 220 that has light settings corresponding to the table entry 202d, may next attempt to decode an image 220b of the set 220 that has light settings corresponding to the table entry 202c, and so on. Once these new decode attempts are completed, points may be assigned to the images in the set 220 (e.g., as described above), a new EMA can be calculated for the sorting values field 206, and a new sorted order for the table 202 determined accordingly.

Generally, table entries for the table 202 that have a favored (e.g., higher) EMA value, as reflected in the values of the sorting values field 206, can be prioritized over (i.e., placed ahead of in the sorted order or acquisition order) entries for the table 202 that have a less favored (e.g., lower) EMA value. In some implementations, however, other rules may additionally (or alternatively) be used.

In some implementations, if a user provides an image acquisition setting, such as a light setting, or related value, the image acquisition (e.g., light) setting (or related value) provided by the user can be prioritized over other image acquisition (e.g., light) settings in the table 202, potentially without regard for the sorted order of the table 202. For example, if a user specifies a particular bright or dark field setting, power setting, or other light setting parameter, decoding attempts can first address images with the light setting (or settings) specified by the user before other images with other light settings from the table 202, even if the other light settings exhibit a more favored (e.g., larger) value for the sorting values field 206 than the light setting specified by the user.

In some implementations, an image acquisition setting (e.g., light setting) for an image that contributed to a successful decoding result in a previous (e.g., immediately preceding) read cycle can be prioritized in a subsequent decoding attempt (for the same or a different symbol). For example, referring again to FIG. 27, if the image 200b contributes to a successful decoding attempt, the light setting for the image 200b can be used, for a subsequent decoding attempt, to select an image from the set 220 with the same light setting as the image 200b, before selecting other images of the set 220 with light settings that did not contribute to a successful decoding (at least in a most recent decoding attempt). This prioritization can be implemented even if the latter light settings correspond to more favored (e.g., larger) values for the sorting values field 206 than the light setting for the image 200b. Similarly, if multiple images of the set 200 (e.g., the images 200a, 200c and 200d) contribute to a successful decoding attempt, the light settings for the images 200a, 200c and 200d can be used, for a subsequent decoding attempt, to select images from the set 220 with the same light settings as the images 200a, 200c and 200d, before selecting other images of the set 220 with light settings that did not contribute to a successful decoding. Again, this prioritization can be implemented even if the latter light settings correspond to more favored (e.g., larger) values for the sorting values field 206 than the light settings for the images 200a, 200c, and 200d.

In some implementations, further sorting can be implemented within (or otherwise in addition to) the prioritization discussed above. For example, the light settings for a set of successfully decoded images (e.g., the images 200a, 200c and 200d) can be prioritized, with respect to each other, based on EMA values corresponding to those images, even as the light settings of the entire set of images (e.g., the images 200a, 200c, and 200d) are prioritized above the light settings for images that did not contribute to a successful decode.

In some implementations, image acquisition (e.g., light) settings for a particular tool (e.g., a two-dimensional matrix tool) can be prioritized over image acquisition (e.g., light) settings for a different tool (e.g., an OCR tool). Prioritizing image acquisition settings for successful decoding attempts based upon the use of a particular tool may be useful in a variety of ways. For example, one goal of image recognition analysis may be to achieve a relatively high read rate and yield of successfully decoded symbols. Accordingly, for example, the imaging manager 210 (or other software, modules, hardware, and so on) may operate to decrease the average read time per imaged product (e.g., per semiconductor wafer) by specifying light settings that may require processing of a relatively small number of images per product. Because Data Matrix and other similar tools may often be required to process a relatively large number of images to achieve a successful decode, it may therefore be useful to prioritize image acquisition (e.g., light) settings for these tools before doing so for other tools. In this way, for example, time-outs of these tools for lack of decodable images may be avoided.

Accordingly, in some implementations, referring again to FIG. 27, light settings for successful decodes using the Data Matrix tool 212 can be prioritized over light settings for successful decodes using the OCR tool 214. For example, if the images 200a, 200b and 200c contribute to a successful decode attempt with the Data Matrix tool 212 and the image 200*d* contributes to a successful decode attempt with the OCR tool 214, the light settings 200*a*, 200*b*, and 200*c* may be moved higher in the sorted order of the table 202 (i.e., may be prioritized) for subsequent selection of images from the set 220 for decoding, even if the light setting for the image 200*d* corresponds to a more favored (e.g., larger) value for the sorting values field 206 than the light settings for the images 200*a*, 200*c*, and 200*d*.

The various tools, modules, algorithms, and so on discussed above may be implemented in various ways using various different types of computing devices and systems. In some implementations, for example, the imaging manager 210 can be combined into one software application with the image acquisition software 44 and/or the symbol locating software 74. In other implementations, the imaging manager 210 can be a separate software application from the image acquisition software 44 and/or the symbol locating software 74. In different implementations, the imaging manager 210 can reside and execute on the computer 50 or on another device (e.g., the imaging device 42).

Referring now to FIGS. 29 through 35, example data for a point assignment, table sorting and image decoding operation are presented. Certain tables and values of FIGS. 29 through 35 may reflect intermediary results of various calculations or processing or may be presented simply to clarify the nature of other tables and values. Accordingly, it will be understood that certain tables and values of the FIGS. 29 through 35 may not necessarily be stored (or stored for substantial amounts of time) or even actually utilized by the system 30. Further, as also noted above, the prioritization and sorting techniques described herein may be used with a variety of image acquisition settings. Accordingly, although light settings are presented as specific examples in the discussion below, it will be understood that similar principles may be applied to other types of image acquisition settings.

Figure 29:
FIG. 29 shows a table with an index of example image acquisition settings for a point allocation, table sorting and image acquisition operation.

Referring in particular to FIG. 29, an example index for various light settings is provided. As depicted, eighteen different light settings 300, designated by bright field ("BF"), dark field ("DF") and power codes ("P"), with associated numerical values, are matched to an index 302 of eighteen integers. As noted above, a light settings table (e.g., the table 202) including the light settings of FIG. 29 can include (e.g., in the light setting field 204) the codes of the light settings 300 themselves, or can include other values indicative of the light settings 300, such as values from the index 302.

In an example operation, images may be acquired using various of the light settings 300. A set of nine read cycles may be attempted for the acquired images (e.g., after or in parallel with the image acquisition), with each read cycle including an attempt to decode a symbol of an acquired image using both a two-dimensional matrix decoding tool and an OCR tool. A set of example results for such an operation are presented in FIG. 30. As indicated by the read cycle column 304 of the table of FIG. 30, each of the read cycles, which are designated as read cycles 1 through 9, includes an attempt to decode a symbol from a number of images, using a particular two-dimensional matrix decoding tool (designated in a tool column 306 of FIG. 30 as "2-D") and a particular OCR tool. In some implementations, the 2-D and OCR tools may operate in series. In some implementations, the 2-D and OCR tools may operate in parallel.

Each image that contributes to a successful result in a particular read cycle is designated in an index column 308 of FIG. 30 by an index value from the light setting index 302 (see FIG. 29) that corresponds to the light setting used to acquire the relevant image. For example, in the first read cycle (i.e., "read cycle 1"), the 2-D tool is used to successfully decode a symbol using two images acquired with light settings BF3 P02 and DF1 P20 (as correspond to the values 11 and 4 of the index 302). Similarly, in the first read cycle, the OCR tool is used to successfully decode a symbol using three images acquired with light settings BF3 P01, DF3 P20, and BF2 P02 (as correspond to the values 3, 6, and 9 of the index 302). For each of the other read cycles, except read cycles 6 and 7, other (or the same) values from the index 302 similarly indicate other (or the same) light settings of images that have been used to successfully decode a symbol in the particular read cycle. For read cycle 6, both tools fail to decode a symbol using any images, so no value is provided from the light setting index 302. For read cycle 7, the OCR tool successfully decodes a symbol with a singleton image with light setting DF3 P20 (corresponding to the value 5 of the index 302), but the 2-D tool did not successfully decode a symbol with any images.

In some implementations, data from the images processed for a particular read cycle can be stitched together, as described above, such that the decoding attempt simultaneously addresses data from multiple images. For example, with respect to the first read cycle, the 2-D tool may have successfully decoded a symbol based on an accumulated (or otherwise at least partly combined) matrix drawn from the two images indicated (i.e., images captured with light settings corresponding to the index values 11 and 4, in the light setting index 302 (see FIG. 29)), and the OCR tool may have successfully decoded a symbol based on the three images indicated (i.e., images captured with light settings corresponding to the index values 3, 6, and 9, in the index 302). Similar use of stitching can also be employed for one or more of the other read cycles, although the depicted read cycle 7, as noted above, includes a successful decode with a singleton.

It will be understood that the images represented by the values of the index 302 in the table of FIG. 30 may not necessarily represent all of the images captured during a particular acquisition operation, or even all of the images for which a decode attempt was made for a particular read cycle, including for singleton decodes and decoding attempts using stitching operations. Rather, as depicted, the table of FIG. 30 represents only those images that actually contributed to a successful decoding attempt for a particular read cycle. As noted above, it may be useful, in various implementations, to assign points only to such contributing images.

After a successful decoding attempt has been completed for a particular read cycle, a point value can be assigned (e.g., by the imaging manager 210) to each of the images that contributed to the successful decoding. As noted above, the magnitude of these point values can generally correspond to the relative contribution of the various images to the various successful decodes. In FIG. 30, the assigned point values are represented in a point value column 316. In the first read cycle of FIG. 30, for example, the image captured with light setting BF3 P02 (corresponding to the value 11 of the index 302) contributed more significantly to the 2-D decoding than the image captured with light setting DF1 P20 (corresponding to the value 4 of the index 302). Accordingly, the BF3 P02 image (index value 11) has been assigned 750 points (out of 1000) and the DF1 P20 (index value 4) has been assigned 250 points.

In contrast, each of the images listed for the successful OCR decoding in the first read cycle contributed approximately equally to the successful decoding, so each image has been assigned 333 points, with one image receiving a rounded-up value of 334 points to ensure that the full 1000 point total has been assigned for that tool and read cycle. In other read cycles, as can be seen in FIG. 30, other (or the same) point values have been assigned based on different (or similar) contributions of various images (and, correspondingly, various light settings) to a successful decoding. It can be seen that zero points have been assigned for read cycle 6, because no successful decoding was achieved. Similarly, zero points have been assigned for the 2-D tool of read cycle 7, because no successful decoding using that tool was achieved. In some implementations, a non-zero minimal impact point value (e.g., a negative number of maximal magnitude, or a minimum positive value on a scoring scale) can be assigned instead.

As noted above, during operations including those in which a successful decoding by both the OCR and 2-D tools is required, minimal impact (e.g., zero) points may be assigned to read cycles in which only one of the tools is successful. In such a case, for example, in the seventh read cycle of FIG. 30, no points may be assigned to the index value 5, because the 2-D tool did not successfully decode a symbol.

As depicted in FIG. 30, a number of total points equal to 1000 has been assigned for each tool for each successful read cycle. In other implementations, other numbers of total points can be used. For example, some implementations may assign a total number of points equal to 1, with various images of a set used for a particular read cycle being assigned fractions of a point such that the entire set of images is assigned 1 point in total.

As also discussed above, the points assigned to various images can be used to update a sorting values field of an acquisition (e.g., light) settings table. In certain implementations, however, points assigned to various images may first need to be scaled appropriately. As depicted in FIG. 31, for example, the total points assigned for decoding operations with both of the two tools (see FIG. 30) for each read cycle have been scaled such that the total points for a given read cycle sum to 1000. For example, with respect to the first read cycle, it can be seen from FIG. 30 that the total points assigned for both the 2-D and OCR tools sum to 2000. Accordingly, these assigned point values have been halved (and rounded, as appropriate) for the first read cycle column (i.e., column 310) of FIG. 31. Likewise, point values assigned for other read cycles have been scaled as appropriate to ensure uniform total point values for each read cycle. It will be noted that the point values assigned for the seventh read cycle (i.e., as reflected in column 314) have not been scaled because only the OCR tool successfully decoded a symbol during that read cycle.

After completion of a particular read cycle (or a relevant portion thereof), an EMA can be calculated for each point value entry (e.g., each point value entry along column 310) using the point values assigned to each particular image (and corresponding light setting) during the particular read cycle, and an EMA value for a previous read cycle (or another initial point value, as discussed below). The results of the EMA calculation can then be used for entries to a corresponding sorting values field of an acquisition (e.g., light) settings table (e.g., the sorting values field 206 of the table 202 in FIGS. 27 and 28). In this way, for example, the value of the sorting values field for a particular image (e.g., light) acquisition setting (e.g., for a particular entry in the index 302 or in the light setting field 204) can be updated to reflect historical decoding results. Accordingly, when an acquisition (e.g., light) settings table is sorted based on the sorting values field, the sorted order of the table can result in prioritization, for subsequent image processing, of image acquisition (e.g., light) settings that have been historically useful.

Referring also to FIG. 32, the successive columns of the depicted table represent the result of successive EMA calculations, based upon the read cycle results and point assignments represented in FIGS. 30 and 31. As also noted above, in some implementations, the total number of point values (e.g., 1000, in the example depicted) may have been initially assigned relatively equally between all (or a subset) of available light settings, in order to provide an initial basis for calculating an EMA (or other average). As can be seen in column 312 of FIG. 32, for example, the 1000 total points for a given read cycle has been initially distributed relatively equally across the entire index 302. In other implementations, other initial assignments of points may be used. For example, a user may provide a custom initial point assignment that may replace the relatively uniform point assignment of column 312. This may be useful, for example, in order to initially prioritize particular light settings over others.

Starting from an initial assignment of points (e.g., as represented in column 312), or another set of point values (e.g., from previous EMA calculations), the values of the sorting values field can then be updated based upon preceding read cycle results. It can be seen from column 318, for example, that after the first read cycle the relatively uniform sorting values field values at initiation (i.e., as represented in column 312) have been updated to reflect the successful decode attempts, during the first read cycle, with images having light settings corresponding to index values 3, 4, 6, 9, and 11 (see FIG. 30). Likewise, as can be seen from column 320, after the second read cycle, the sorting values fields after the first read cycle (see column 318) have been updated to reflect the light settings of the images used for successful decoding during the second read cycle.

In the example depicted in FIG. 32, an EMA smoothing constant of 0.0392157 has been used, as calculated by assuming a period value of 50 entries. In various implementations, assuming such a period value may be useful because analysis cycles for semiconductor wafers may typically include acquisition of images for analysis of sets of 50 wafers. In other implementations, other period values (and other smoothing constants) may be used, as appropriate.

After a particular read cycle, an acquisition settings table (e.g., the light settings table 202) may be sorted based on the updated EMA values from the read cycle (and previous processing). For example, the various read cycle columns of FIG. 32 (e.g., columns 318 and 320, and so on) can represent stored entries for a light settings table (e.g., the light settings table 202) following each respective read cycle.

Based upon the EMA values depicted in FIG. 32 (or other similar values), an acquisition settings table (e.g., the light settings table 202) can be sorted such that historically successful image acquisition (e.g., light) settings may be prioritized in subsequent processing of images to decode symbols. As depicted in FIG. 33, for example, the light setting index values from the index 302 (see, e.g., FIG. 32) have been sorted based on the assigned, scaled, and averaged point values reflected in the read cycle columns of FIG. 32. For example, as depicted in FIG. 32, after the first read cycle the light settings index 11 of index 302 corresponds to the highest EMA value of column 318, followed sequentially by light settings indices 3, 6, and 9, and light setting index 4. Accordingly, in the sorted column 318a of FIG. 33, these light settings indices have been moved to the top of the sorted order. As a result, when this sorted order is stored (or otherwise reflected) in an acquisition (e.g., light) settings table that is accessed to determine appropriate image acquisition (e.g., light) settings of images for a subsequent decoding attempt (for the same or a different symbol), the image acquisition (e.g., light) settings corresponding to the light setting indices 11, 3, 6, 9 and 4 can be prioritized.

As depicted, the various columns (e.g., columns 318*a* and 320*a*) have been sorted such that the higher-scoring light settings are prioritized (i.e., moved up in the sorted order) and lower-scoring light settings are given a lower priority (i.e., moved down in the sorted order). In other implementations, other sorting algorithms may be used, including as applied to other types of image acquisition settings.

In some implementations, the sorted order of the light setting index 302 (e.g., as reflected in the columns 318*a* and 320*a*) may dictate the order in which images are subsequently analyzed to decode a symbol. As can be seen in FIG. 33, however, the light settings that actually resulted in a successful decoding for certain read cycles, as indicated by shaded cells, may not be highly prioritized by value-based sorting alone. For example, although light settings 8, 13, and 14 contributed to a successful decode in read cycle 8, these light settings are relatively far down the sorted order in sorted column 322. Accordingly, it may sometimes be useful to adjust the sorted order (e.g., as based on updated EMA values) such that light settings that actually contribute to a successful decode (e.g., in an immediately preceding decoding attempt) are moved to a block of entries at the top of the sorted order.

Figure 34:
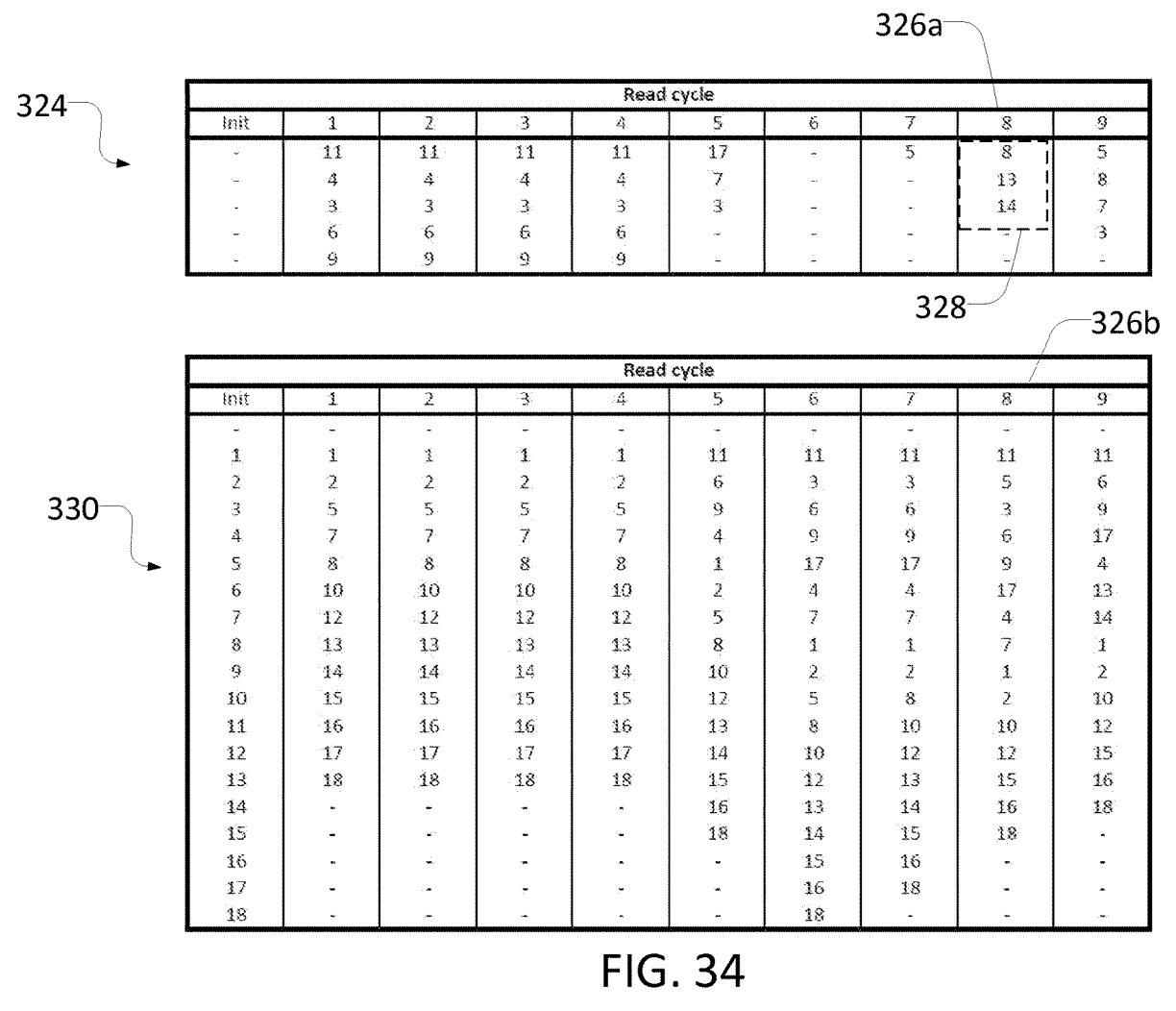

Examples of such blocks of entries for each read cycle are presented in a table 324 in FIG. 34. For example, in column 326*a* of the table 324, a block 328 for read cycle 8 can include images with light settings 8, 13, and 14 because these images actually contributed to a successful decoding attempt in the read cycle 8 (see column 322 in FIG. 33). The remaining light setting index values (i.e., those not included in a block in the table 324) are presented in a table 330 of FIG. 34, sorted according to the EMA values presented in FIG. 32. It will be noted that the table 330, for a given read cycle, does not include the light setting index values that are included, for that read cycle, in the table 324. For example, column 326*b* of the table 330, representing a sorted set of index values for read cycle 8 does not include the index values 8, 13, and 14, because these values are included in the block 328 of the table 324.

In order to guide selection of images for subsequent processing, the tables 324 and 330 may be combined, with various blocks (e.g., the block 328) of the table 324 being maintained ahead of the index values of the corresponding column of the table 330 in the resulting sorted order. Additionally, the sorted index values can be shifted forward by one read cycle (or more), such that the sorted index values can be viewed as prescriptive values for a subsequent read cycle as well as indicative values for the read cycle from which they were calculated. In this way, for example, sorted index values derived from an earlier read cycle may be used to prioritize certain image acquisition settings for a later read cycle.

Figure 35:
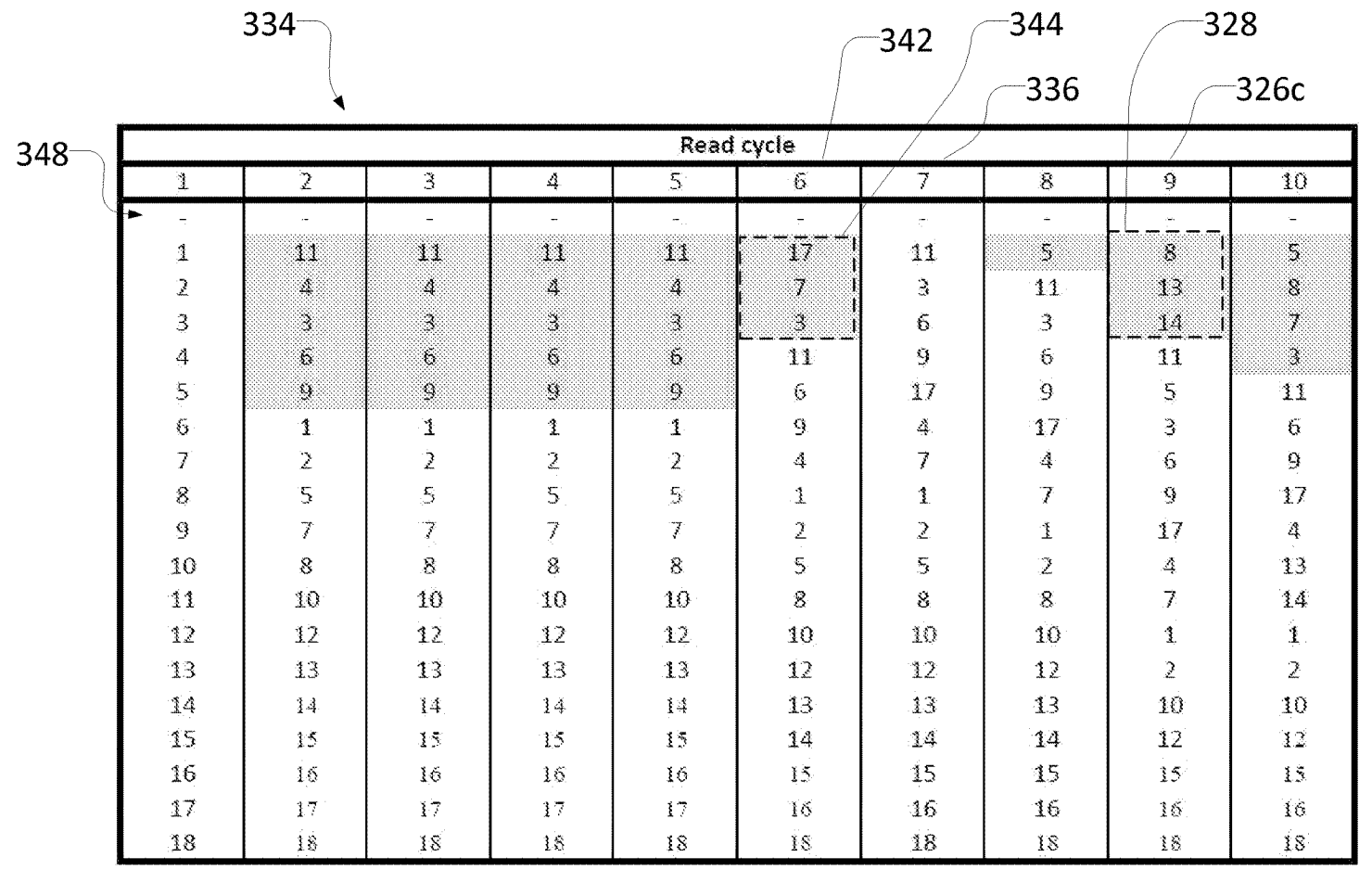

Referring also to FIG. 35, a light setting index table 334 represents one example combination of the tables 324 and 330. As depicted, for example, a column 326*c* for a ninth read cycle (i.e., a read cycle subsequent to the eighth read cycle) includes the block 328 of light setting index values from the table 324 of FIG. 34, followed by the ordered index values of column 326*b* from the table 330 of FIG. 34. As also discussed above, the order of the light setting index values depicted in FIG. 35 (and, accordingly, the prioritization of light settings during the read cycle 9) is based on the sorted order of the corresponding EMA values (see FIG. 32), updated to reflect the prioritization of light settings that actually resulted in a successful decoding for certain read cycles (see FIG. 34, block 328). Accordingly, during the read cycle 9, images having light settings corresponding to the index values 8, 13, and 14 can be selected first for decoding, followed by images having light settings in the remaining sorted order of the column 326*c*.

Where no image has contributed to a successful decoding attempt for a particular read cycle, the sorted order may not be updated based on light settings of images that have actually contributed to successful decoding. For example, with reference to FIGS. 30, and 33-35, it can be seen that no image was successfully decoded during read cycle 6 (as reflected for read cycle 7 in FIG. 35). Accordingly, no block of light settings is provided in the table 324 of FIG. 34 or in the sorted order of light settings for read cycle 7 in the table 334 (i.e., as reflected in column 336).

Still referring to read cycles 6, it can be seen in FIG. 32 that the EMA values between cycle 5 (i.e., as reflected in column 338) and cycle 6 (i.e., as reflected in column 340) have not changed. Because no successful decoding resulted from the read cycle 6 (see FIG. 30), no point values have been assigned to images based on the read cycle 6, and EMA values from the read cycle 5 (column 338) have been simply carried forward to the read cycle 6 (column 340). With reference to FIG. 35, however, it can be seen that the sorted order of the column 336, determined with reference to the results of the read cycle 6, vary from the sorted order of the column 342. This is because the sorted order of the column 342 has been updated to prioritize a block 344 of indices corresponding to images contributing to a successful decoding attempt in read cycle 5 (see, e.g., FIGS. 30 and 34).

Referring generally to FIGS. 32 through 35, it can be seen that no user-specified light setting ("User Entry") has been provided for the depicted example, However, a placeholder has been maintained for the User Entry within the sorted table of FIG. 33 (see User Entry row 346) and the updated sorted table 334 of FIG. 35 (see User Entry row 348). If a user specifies a particular light setting (or aspect thereof), such a User Entry may be prioritized in a subsequent read cycle, even above light settings that contributed to previously successful decoding attempts.

As noted above, it will be understood that the tables presented in FIGS. 29 through 35 may not necessarily be stored in their entirety by the system 30 or included in their entirety in a particular table or other repository of the system 30 (e.g., the light settings table 202). For example, in some implementations, the system 30 may simply store a table similar to the table 202 (see FIG. 27), a sorted order of which may be updated after each successful read cycle based on the analysis depicted in FIGS. 29 through 35.

In some implementations, it may be useful to limit the number of images which may have their data stitched together for a decoding operation. For example, for decoding operations using a two-dimensional matrix symbol decoding tool, stitching of data from an excessive number of images may degrade rather than improve decoding results. Accordingly, in some implementations, a maximum number of images may be specified for assignment of point values, for a particular read cycle. If an initial set of images does not result in a successful decode before the initial set reaches the maximum number of images, a new decode attempt (within the same read cycle) can commence with a different set of images. In some implementations, for example, a maximum number of eight images can be specified, such that if a set of eight images does not result in a successful decode with the relevant tool, a new set of eight images may be used for a new decoding attempt.

Even if a particular set of images does not result in a successful decode, however, certain images within the set may still be valuable to subsequent decoding attempts. Accordingly, in some implementations, when an initial set of images fails to result in a successful decoding attempt and a new set of images is assembled for a new decoding attempt, a highest scoring (one or more) image from the initial set of images can be designated as part of (e.g., carried over as a "seed" image for) the new set of images. In such a case, assignment of point values to images in the new (or other) set can be moderated based on the nature of the successful decoding of the designated image from the initial image set. For example, where a seed image from an initial set of images contributes to a successful decoding attempt with a new set of images, the seed image can be assigned an enhanced point value (e.g., 600 of 1000 points), with the remaining points (e.g., 400 of 1000 points) being assigned among the remaining images of the new set of images.

Referring to FIG. 36, for example, a stitching analysis of an initial set 350 of images may not result in a successful decoding attempt, but an image 352 of the set 350 may score relatively highly compared to the other images 352 with respect to decoding attempts on the set 350 (e.g., with respect to the representation of a symbol (or symbol part) in the image 352). Because a maximum number of images (e.g., eight images) may have been included already in the set 350, additional images may no longer be added to the set 350. Rather, a new set 354 of images may be obtained. Because the image 352 scored relatively highly, however, with respect to decoding attempts on the set 350, the image 352 may be carried over into the new set 354 of images as a seed image for that set.

In some implementations, other operations can be implemented in order to use information from an image of the initial set 350 of images in conjunction with information from images acquired for the new set 354 of images. For example, after a highest (or otherwise relatively highly) scoring image of the initial set 350 has been identified, that image can itself be designated for the new set 354 or another image that was acquired with the same acquisition settings as the highest scoring image can be designated for the new set 354. The designated image (e.g., the image 352 or a similarly-acquired other image) can be actually saved as part of the new set 354, or information from the designated image can be used along with information from other images in the new set 354 without saving the image 352 as part of the new set 354. As an example of the latter case, where the image 352 has been designated for the new set 354, the image 352 can be processed for decoding without necessarily being saved in its entirety as part of the new set 354. Results of the processing of the image 352 can then be used in combination with results of processing of other images in the new set 354 to attempt to decode a relevant symbol.

In some implementations, particular strategies may be used for assigning points to images analyzed using an OCR tool. For example, if an image allows for successful decoding of one or more characters at particular positions, the image can be assigned a percentage of available points per character. For example, where a twelve-character string of text is to be decoded, an image that allows for successful decoding of one or more characters of the string can be assigned approximately 8.3% of the available points per character.

As another example, if one image allows for successful decoding of an entire string of characters, the one image may be assigned the total amount of available points. However, if one image allows for successful decoding of string but one or more other images allow for successful decoding of particular characters of the string, point values may be assigned among each of the contributing images. For example, an image providing for successful decoding of the string as a whole can be assigned a fixed percentage (generically, X percent) of the points available and the other image (or images) can be assigned points calculated as $$\text{Points}=1/(C_T)\cdot(100-X)/100\cdot C_D, \qquad (2)$$

where $C_T$ indicates the total number of characters in the string and $C_D$ indicates the number of characters decoded based on the image to which the points are to be assigned.

In some implementations, the number of available image acquisition (e.g., light) settings may change over the course of an operation or series of operations. For example, with respect to the system 30, a user may be able to enable or disable auxiliary light settings, such that the number of available light settings can change depending on user input. When a table of EMA values for various light (or other image acquisition) settings has been constructed (e.g., as discussed above), and additional light (or other image acquisition) settings become available, it may be useful to ensure that the sum of the EMA values, including those for the additional light (or other image acquisition) settings, remains equal to the maximum number of points (e.g., 1000 points, in the examples above). Accordingly, when additional light (or other image acquisition) settings become available, the additional light (or other image acquisition) settings can be initially assigned EMA values of zero.

Similarly, when a table of EMA values for various image acquisition (e.g., light) settings has been constructed (e.g., as discussed above), and some of the image acquisition (e.g., light) settings are made unavailable for subsequent decoding operations, the EMA values for the newly unavailable image acquisition (e.g., light) settings can be distributed among the remaining image acquisition (e.g., light) settings. In this way, for example, the sum of EMA values for available image acquisition (e.g., light) settings remains equal to the maximum number of points. Further, if the EMA values for the newly unavailable image acquisition (e.g., light) settings are distributed evenly among the remaining image acquisition (e.g., light) settings, a current sorted order of the remaining image acquisition (e.g., light) settings (e.g., as based on the EMA values) can be maintained.

In some implementations, each decoding tool can provide a ResultContributors vector via a getter function in both the success and failure case, including under the following instructions:

```
struct ImageContribution
{
    unsigned ImageIndex;
    unsigned Weight;
};
typedef std::vector<ImageContribution> ResultContributors;
const ResultContributors& getResultContributors( );
```

As such, the sets returned by the tool can include an image index (e.g., as may indicate a light (or other image acquisition) setting, similar to the index 302 of FIG. 29) and the point value that the tool may have assigned to the image.

In some implementations, the image index returned by the tool can indicate the order with which a particular image was passed to the tool for analysis (or a corresponding location of the relevant image acquisition setting in an image acquisition setting table). For example, if an image exhibiting light settings corresponding to the seventh entry of a light settings table is passed to a tool and this image contributes to the decode then the image index value can be returned with a value of 7.

In some embodiments, for a failure case of analysis of a set of images by a tool, an image that is deemed the best for display by the tool can be assigned a maximum point value (e.g., a point value of 1000) and the remaining images in the set will receive a value of 0. In other embodiments, no points may be assigned to any image for an unsuccessful decoding attempt.

Under the example instructions presented above, when a tool successfully decodes a symbol in a particular read cycle, the ResultContributors vector may address only to the images that contributed to the successful decoding. In a failure case, however, other images may be addressed.

In some implementations, sorting similar to that described above with respect to acquisition settings can be used with regard to post-acquisition processing. For example, different post-acquisition processing (e.g., application of different image filter settings or region of interest adjustments) can be applied to different acquired images. A post-acquisition settings order can be determined based upon the contribution of the various post-processed images to a decoding attempt for the images, with post-acquisition processing settings for images having stronger contributions to a decoding attempt being assigned a higher impact (e.g., larger) point value than post-acquisition processing settings for images having weaker contributions to the decoding attempt. In some implementations, this assignment of points can proceed in similar ways to the assignment of points discussed above for acquisition order.

Once determined, the post-acquisition settings order can then be used to guide subsequent decoding attempts. For example, the post-acquisition settings order (e.g., as updated for successive read cycles) may be used to determine an order of application of post-acquisition processing to images that will be subject to a new decoding attempt, or to prioritize decoding attempts for certain images that have already been processed with particular post-acquisition processing settings.

Referring again to FIGS. 34 and 35, for example, different types of post-processing may have been applied to the images with light settings 8, 13, and 14 during read cycle 8, which may at least partly contribute to the relative contributions of those images to a decode attempt and the corresponding elevated point assignments for those images. Based on the point assignments, and the particular types of post-processing used for particular images, a post-acquisition processing settings order can be determined for particular types of post-processing or particular images. During read cycle 9, particular post-acquisition processing can then be applied to acquired images, or particular post-processed images prioritized for decoding, based on the post-acquisition processing settings order. For example, post-acquisition processing settings for a new image can be determined based upon the prioritization of the settings in the post-acquisition processing settings order.

In some implementations, a determined acquisition-settings order can inform a processing order (e.g., an order in which images are processed to attempt to decode a symbol) as an alternative (or in addition to) informing an acquisition order. For example, still referring to FIG. 35, an acquisition-settings order for the read cycle 10 may prioritize, in order, the acquisition settings indicated by index values 5, 8, 7, and 3. In some implementations, processing to attempt to decode images from the read cycle 10 can be implemented based upon this order (i.e., 5, 8, 7, then 3) even if the images for the read cycle 10 were acquired with a different order of acquisition settings (e.g., 8, 7, 5, then 3). In this regard, therefore, the acquisition-settings order represented in FIG. 35 can alternatively (or additionally) be viewed as a processing order for acquired images, which can specify the order in which images acquired with particular acquisition settings can be processed to attempt to decode symbols represented therein.

Although the present technology has been described with reference to preferred embodiments, workers skilled in the art will recognize that changes may be made in form and detail without departing from the spirit and scope of the technology. For example, the present technology is not limited to the embodiments of 2D data matrix symbols, and may be practiced with other machine readable symbol technology.

The specific methods described herein can be generalized to handheld applications, and the correspondence methods described herein can be generalized to pattern alignment applications.

The technology disclosed here can be applied to stitching data for other ID application such as OCR reading from multiple images. A known method of OCR reading from multiple images is to select read characters with the highest score from individual images. The known method requires individual characters to be readable from at least one image. With this technology, the character reading can occur after the individual strokes of a character are combined from multiple images.

The particular embodiments disclosed above are illustrative only, as the technology may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the technology. Accordingly, the protection sought herein is as set forth in the claims below.

What is claimed is:

1. A system for decoding a symbol using images of the symbol, the system comprising:
   an imaging device configured to acquire multiple images, each of the acquired images including a respective symbol data region;
   a processor operatively coupled to the imaging device, the processor configured to:
      receive a first plurality of images for a first read cycle of the system, the first plurality of images being acquired by the imaging device in a first acquisition order using respective acquisition settings, the first plurality of images including first and second images that are acquired, respectively, using first and second acquisition settings determined according to an initial acquisition-settings order;
      execute a data stitching algorithm including:
         generating a synthetic model of the symbol, the synthetic model being a model of a plurality of known features of the symbol;
         comparing the synthetic model of the symbol with at least the first and second images;

converting a first symbol data region of the first image into a first binary matrix and converting a second symbol data region of the second image into a second binary matrix; and at least partly combining the first binary matrix with the second binary matrix to generate a combined binary matrix, the combined binary matrix being a decodable representation of the symbol;

attempt to decode the symbol based at least partly upon the combined binary matrix; and receive a second plurality of images for a second read cycle of the system, the second plurality of images being acquired by the imaging device in a second acquisition order using updated acquisition settings that are determined according to an updated acquisition-settings order, the updated acquisition-settings order being determined based at least partly upon first and second contributions of the first and second images, respectively, to the attempt to decode the symbol.

2. The system of claim 1, wherein, when the first image contributes to a successful decoding of the symbol to a greater extent than the second image contributes to the successful decoding of the symbol, the first acquisition settings are determined to be ahead of the second acquisition settings in the updated acquisition-settings order.

3. The system of claim 1, wherein when a user specifies acquisition settings for the second read cycle that differ from the first and second acquisition settings, the user-specified acquisition settings are determined to be ahead of the first and second acquisition settings in the updated acquisition-settings order.

4. The system of claim 1, wherein, to determine the updated acquisition-settings order based at least partly upon the first and second contributions, the processor is further configured to:

assign for the first and second acquisition settings, respectively, point values associated with the first and second contributions;

calculate a respective average, for each of the first and second acquisition settings, based at least partly upon respective previously determined scores for the first and second initial acquisition settings and based at least partly upon the respective point values assigned for the first and second acquisition settings; and determine the updated acquisition-settings order based at least partly upon the calculated averages.

5. The system of claim 4, wherein minimal impact points are assigned for at least one of the first and second acquisition settings based at least partly upon the corresponding at least one of the first and second images not contributing to a successful decoding of the symbol.

6. The system of claim 4, wherein the averages are calculated only if the attempt to decode the symbol results in a successful decoding of the symbol for the first read cycle.

7. The system of claim 4, wherein the calculation of the averages is based at least partly upon the processor accessing a stored acquisition settings table including a number of table entries, each table entry including an acquisition settings field and a sorting value field, the sorting value field for a particular table entry indicating, respectively, the previously determined score for the acquisition settings indicated by the acquisition settings field for the particular table entry.

8. The system of claim 7, wherein the processor is further configured to update the entries of the sorting value field, respectively, based at least partly upon the calculated averages; and wherein the updated acquisition-settings order is determined based at least partly upon the updated entries of the sorting value field.

9. The system of claim 1, wherein to determine the updated acquisition-settings order, the processor is further configured to:

set a maximum number of images for a given decoding attempt;

identify a first subset of the first plurality of images that contains the maximum number of images;

process the first subset of images to attempt to decode the symbol;

if the processing of the first subset results in a successful decoding of the symbol, assign point values for the acquisition settings used to acquire the images of the first subset; and if processing of the first subset does not result in a successful decode:

identify a highest scoring image of the first subset, the highest scoring image having been acquired with particular acquisition settings;

designate, as part of a second subset of the first plurality of images that contains the maximum number of images, at least one of the highest scoring image of the first subset and another image acquired with the particular acquisition settings;

process the second subset of images to attempt to decode the symbol; and if the processing of the second subset results in a successful decode, assign point values for the acquisition settings used to acquire the images of the second subset.

10. A method for decoding a symbol using images of the symbol, the method comprising:

generating a synthetic model of the symbol, the synthetic model being a model of a plurality of known features of the symbol;

acquiring, using an imaging device, a first image and a second image for a first read cycle, the first image being acquired using first acquisition settings and including a first symbol data region, and the second image being acquired using second acquisition settings and including a second symbol data region;

comparing the synthetic model of the symbol with the first image and extracting a first binary matrix;

comparing the synthetic model of the symbol with the second image and extracting a second binary matrix;

at least partly combining the first binary matrix with the second binary matrix; and generating a combined binary matrix, the combined binary matrix being a decodable representation of the symbol;

attempting to decode the symbol based at least partly upon the combined binary matrix;

identifying first and second contributions, respectively, of the first and second images to the attempt to decode the symbol;

determining an updated acquisition-settings order for at least the first and second acquisition settings, based at least partly upon the first and second contributions; and causing the imaging device to acquire a third image for a second read cycle, the third image being acquired using third acquisition settings that are determined based at least partly upon the updated acquisition-settings order.

11. The method of claim 10, wherein, when the first image contributes to a successful decoding of the symbol to a greater extent than the second image contributes to the successful decoding of the symbol, the first acquisition settings are determined to be ahead of the second acquisition settings in the updated acquisition-settings order.

12. The method of claim 10, wherein when a user specifies acquisition settings for the second read cycle, the user-specified acquisition settings are determined to be ahead of the first and second acquisition settings in the updated acquisition-settings order.

13. The method of claim 10, wherein determining the updated acquisition-settings order based at least partly upon the first and second contributions includes:
  assigning to the first and second acquisition settings, from a predefined number of total points, point values associated with the first and second contributions, respectively;
  calculating a respective moving average, for each of the first and second acquisition settings, based at least partly upon respective previously determined scores for the first and second initial acquisition settings and based at least partly upon the respective point values assigned for the first and second acquisition settings; and
  determining the updated acquisition-settings order based at least partly upon the calculated moving averages.

14. The method of claim 13, wherein minimal impact points are assigned for at least one of the first and second acquisition settings based at least partly upon the corresponding at least one of the first and second images not contributing to a successful decoding of the symbol.

15. The method of claim 13, wherein the moving averages are calculated only if the attempt to decode the symbol results in a successful decoding of the symbol for the first read cycle.

16. The method of claim 10, wherein at least one of the first, second, and third acquisition settings specifies at least one of a light mode, image exposure, image gain, and image offset.

17. The method of claim 10, wherein the attempt to decode the symbol is further based at least partly upon applying post-acquisition processing to the first and second images according to first and second post-acquisition processing settings, respectively, the first and second post-acquisition processing settings including one or more of an image filter setting and a region of interest adjustment;
  wherein the method further includes determining an updated post-acquisition settings order based at least partly upon the first and second contributions; and
  wherein the third image is processed, after being acquired, using third post-acquisition processing settings determined based at least partly upon the updated post-acquisition settings order.

18. A method for decoding a symbol using images of the symbol, wherein first images have been acquired in a first acquisition order with an imaging device using an initial sequence of respective acquisition settings that is determined based at least partly upon an initial acquisition-settings order, the method comprising:
  processing the first images to attempt to decode the symbol by, at least in part, stitching image data from two or more of the first images;
  identifying, for at least one of the two or more of the first images that was acquired using at least one of the initial acquisition settings, a corresponding at least one contribution to the attempt to decode the symbol;
  determining an updated acquisition-settings order for the collective initial acquisition settings based at least partly upon the at least one contribution; and
  at least one of acquiring second images, with the imaging device, using an updated sequence of second acquisition settings that is determined based at least partly upon the updated acquisition-settings order and processing the second images in a decoding attempt using a processing order that is determined based at least partly upon the updated acquisition-settings order.

19. The method of claim 18, wherein the attempt to decode the symbol includes applying post-acquisition processing to the two or more of the first images based at least partly upon an initial post-acquisition settings order;
  wherein the method further includes determining an updated post-acquisition settings order based at least partly upon the at least one contribution; and
  wherein the second images are processed, after being acquired, based at least partly upon the updated post-acquisition settings order.

20. The method of claim 19, wherein the post-acquisition processing includes at least one of applying one or more image filters to at least one of the two or more of the first images and adjusting one or more regions of interest for at least one of the two or more of the first images; and
  wherein the initial and updated post-acquisition settings orders indicate, respectively, initial and updated orders for the at least one of applying one or more image filters and adjusting one or more regions of interest.

21. A system for decoding a symbol using images of the symbol, the system comprising:
  an imaging device configured to acquire multiple images, each of the acquired images including a respective symbol data region;
  a processor operatively coupled to the imaging device, the processor configured to:
    receive a first plurality of images for a first read cycle of the system, the first plurality of images being acquired by the imaging device in a first acquisition order using respective acquisition settings, the first plurality of images including first and second images that are acquired, respectively, using first and second acquisition settings determined according to an initial acquisition-settings order;
    execute a data stitching algorithm including:
      generating a synthetic model of the symbol, the synthetic model being a model of a plurality of known features of the symbol;
      comparing the synthetic model of the symbol with at least the first and second images;
      converting a first symbol data region of the first image into a first binary matrix and converting a second symbol data region of the second image into a second binary matrix; and
      at least partly combining the first binary matrix with the second binary matrix to generate a combined binary matrix, the combined binary matrix being a decodable representation of the symbol;
    attempt to decode the symbol based at least partly upon the combined binary matrix; and
    receive a second plurality of images for a second read cycle of the system, the second plurality of images being processed for decoding in a processing order, the processing order being determined based at least partly upon first and second contributions of the first and second images, respectively, to the attempt to decode the symbol.

22. The system of claim 21, wherein, when the first image contributes to a successful decoding of the symbol to a greater extent than the second image contributes to the successful decoding of the symbol, images acquired with the first acquisition settings are determined to be ahead of images acquired with the second acquisition settings in the processing order.

23. The system of claim 21, wherein when a user specifies acquisition settings for the second read cycle, images acquired with the user-specified acquisition settings are prioritized in the processing order.

24. The system of claim 21, wherein, to determine the processing order based at least partly upon the first and second contributions, the processor is further configured to:
assign for the first and second acquisition settings, respectively, point values associated with the first and second contributions;
calculate a respective average, for each of the first and second acquisition settings, based at least partly upon respective previously determined scores for the first and second initial acquisition settings and based at least partly upon the respective point values assigned for the first and second acquisition settings; and
determine the processing order based at least partly upon the calculated averages.

25. The system of claim 24, wherein minimal impact points are assigned for at least one of the first and second acquisition settings based at least partly upon the corresponding at least one of the first and second images not contributing to a successful decoding of the symbol.

26. The system of claim 24, wherein the averages are calculated only if the attempt to decode the symbol results in a successful decoding of the symbol for the first read cycle.

27. The system of claim 24, wherein the calculation of the averages is based at least partly upon the processor accessing a stored acquisition settings table including a number of table entries, each table entry including an acquisition settings field and a sorting value field, the sorting value field for a particular table entry indicating, respectively, the previously determined score for the acquisition settings indicated by the acquisition settings field for the particular table entry.

28. The system of claim 27, wherein the processor is further configured to update the entries of the sorting value field, respectively, based at least partly upon the calculated averages; and
wherein the processing order is determined based at least partly upon the updated entries of the sorting value field.

29. The system of claim 21, wherein to determine the processing order, the processor is further configured to:
set a maximum number of images for a given decoding attempt;
identify a first subset of the first plurality of images that contains the maximum number of images;
process the first subset of images to attempt to decode the symbol;
if the processing of the first subset results in a successful decoding of the symbol, assign point values for the acquisition settings used to acquire the images of the first subset; and
if processing of the first subset does not result in a successful decode:
identify a highest scoring image of the first subset, the highest scoring image having been acquired with particular acquisition settings;
designate, as part of a second subset of the first plurality of images that contains the maximum number of images, at least one of the highest scoring image of the first subset and another image acquired with the particular acquisition settings;
process the second subset of images to attempt to decode the symbol; and
if the processing of the second subset results in a successful decode, assign point values for the acquisition settings used to acquire the images of the second subset.

* * * * *